US 6,711,725 B1

(12) United States Patent
Rutenbar et al.

(10) Patent No.: US 6,711,725 B1
(45) Date of Patent: Mar. 23, 2004

(54) METHOD OF CREATING CONFORMAL OUTLINES FOR USE IN TRANSISTOR LEVEL SEMICONDUCTOR LAYOUTS

(75) Inventors: Rob A. Rutenbar, Pittsburgh, PA (US); Donald B. Reaves, Pittsford, NY (US); Elias L. Fallon, Tempe, AZ (US)

(73) Assignee: Neolinear, Inc., Pittsburgh, PA (US)

( * ) Notice: Subject to any disclaimer, the term of this patent is extended or adjusted under 35 U.S.C. 154(b) by 157 days.

(21) Appl. No.: 10/062,121

(22) Filed: Jan. 31, 2002

Related U.S. Application Data
(60) Provisional application No. 60/269,264, filed on Feb. 15, 2001.

(51) Int. Cl.[7] .................................................. G06F 5/45
(52) U.S. Cl. ............................ 716/8; 716/9; 716/11
(58) Field of Search ......................... 716/1, 7, 8, 9, 716/10, 11, 12, 13, 14, 15, 16, 17, 18

(56) References Cited

U.S. PATENT DOCUMENTS

| | | | | |
|---|---|---|---|---|
| 6,088,519 A | * | 7/2000 | Koford | 716/9 |
| 6,189,132 B1 | * | 2/2001 | Heng et al. | 716/11 |
| 6,412,100 B1 | * | 6/2002 | Sasagawa et al. | 716/9 |
| 6,415,425 B1 | * | 7/2002 | Chaudhary et al. | 716/9 |
| 6,587,992 B2 | * | 7/2003 | Marple | 716/2 |

* cited by examiner

Primary Examiner—Vuthe Siek
Assistant Examiner—Binh Tat
(74) Attorney, Agent, or Firm—Webb Ziesenheim Logsdon Orkin & Hanson, P.C.

(57) ABSTRACT

A conformal outline of a well which is to receive elements of a circuit is formed from one or more candidate rectangles which enclose input rectangles. The one or more candidate rectangles are determined based upon a cost of the candidate rectangles determined therefor based on the overlap of the candidate rectangles with one or more penalty or avoid rectangles. Each input rectangle represents an area where it is desired to place elements of the circuit and each penalty or avoid rectangle represent an area where it is desired to avoid placing elements of the circuit. To determine the candidate rectangle(s) having the most advantageous cost, a side and/or an edge of each candidate rectangle is positioned at or near plural locations where the sides and/or edges of the input rectangles reside and a cost is determined therefor. The candidate rectangle(s) having the most favorable cost are then utilized as solution rectangles for the conformal outline.

19 Claims, 21 Drawing Sheets

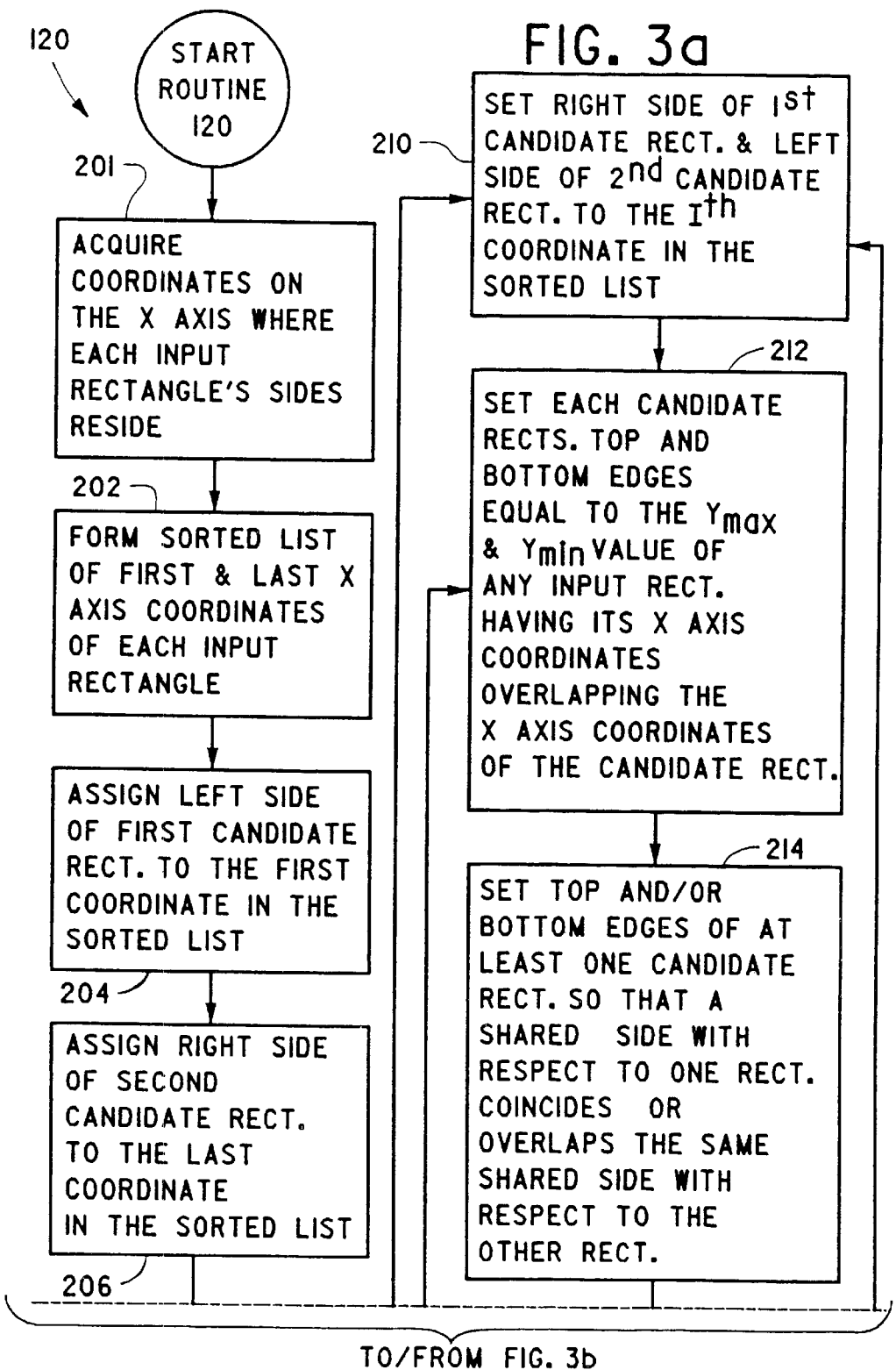

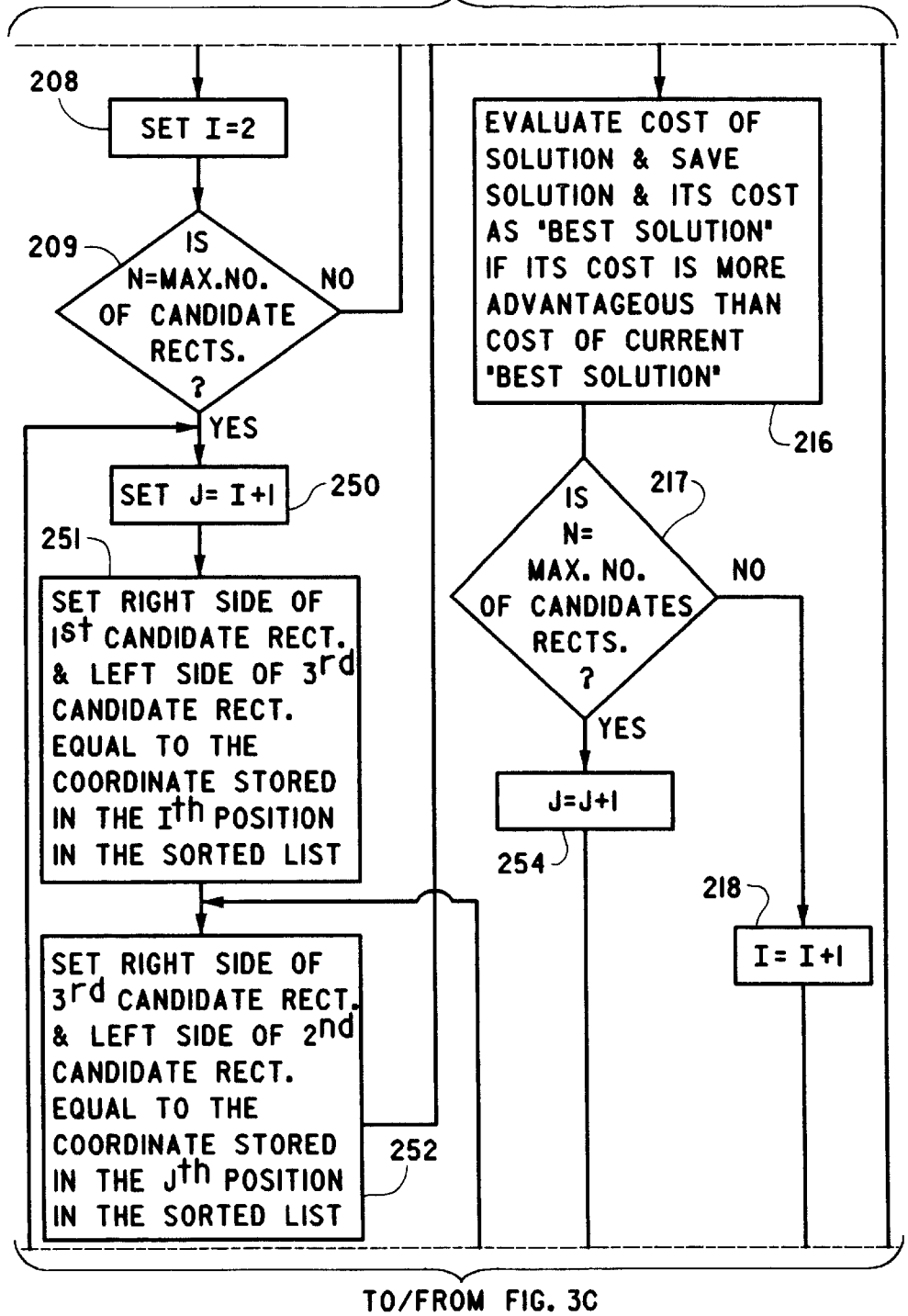

TO/FROM FIG. 3e

METHOD OF CREATING CONFORMAL OUTLINES FOR USE IN TRANSISTOR LEVEL SEMICONDUCTOR LAYOUTS

CROSS REFERENCE TO RELATED APPLICATIONS

This application claims priority from U.S. Provisional Patent Application Ser. No. 60/269,264, filed Feb. 15, 2001, entitled "Quick Creation Of Conformal Outlines For Use In Transistor Level Semiconductor Layouts".

BACKGROUND OF THE INVENTION

1. Field of the Invention

The present invention relates to automatic layout of one or more elements of an integrated circuit, especially analog elements, and, more particularly, to the creation of conformal outlines used in the layout of these elements.

2. Brief Description of the Prior Art

In order to realize the high levels of integration that are occurring with system-on-chip designs, analog and digital functionality are being included on more semiconductor chips than ever. As more of these mixed signal chips are created, automation for the layout of the analog segments of these chips is required. Currently, this is an almost completely manual process.

An analog cell is typically a circuit, such as an operational amplifier or comparator, that includes between ten and one hundred elements, such as transistors, resistors and capacitors. In order to automatically lay out these elements to create a circuit, a large amount of detailed geometry needs to be optimized. For example, the placement of elements needs to take maximal advantage of design rules to create a compact and correct layout. One aspect of detailed geometric creation that can have a dramatic impact on the compactness and correctness of an analog cell layout is the well and latchup of protection geometry.

In a typical silicon semiconductor process, mask layers are created where each N-well is created and where each P-well is created. All N-type transistors must be surrounded by a P-type well and vice versa. These wells need to be electrically connected to the correct voltages or the transistors may not perform optimally, and in the worst case will not work at all. The geometry used to electrically connect the well to the rest of the circuitry is referred to as latchup protection geometry.

While the problems of creating wells and latchup protection geometry also occur in the layout of digital circuits, the solutions used to create well and latchup protection geometry for digital layouts are different than the solutions required for layout of analog cells. Specifically, for most digital cells, the transistors are very similarly sized and small. These transistors tend to share active regions in addition to sharing well geometry. The methodology most often used to create digital cells is to first define the areas of the cell where the P and N wells are positioned and then to place the transistors in those areas. In contrast, in an analog layout, the devices may be much larger and may also have differing sizes. Therefore, it is preferred to first place the devices, then form the wells around the devices.

Another difference between digital cell layout and analog cell layout is the voltage to which each well is connected. For digital layouts, the wells are almost always tied to power and ground. In contrast, analog circuits tend to have more wells that are tied to voltages other than power and ground.

In general, the rules on how a well geometry is created simply specify that the well geometry must enclose certain geometry of the devices by given amounts. The rules for where latchup protection must be formed in a well geometry, however, are more complicated. Specifically, latchup protection must be formed in the well area with the devices and must be placed so that it can effectively keep the entire well at a desired voltage. In general, this latter condition is expressed as a radius from which all the devices in the well must be located from the latchup protection geometry.

In addition to these physical rules, there are constraints on the performance of an automated solution for the creation of well and latchup protection geometry. Namely, it must be fast enough to be used in automatic layout where a large number of candidate solutions, each having well and latchup protection geometry, may need to be evaluated. The solution must also be fast enough to be used in an interactive mode to assist the designer with manual placement.

The wells that are created must also satisfy aesthetic constraints in order to be acceptable to designers. These constraints can be roughly expressed to be that the well shapes should have low complexity. Shapes with rough, jagged edges are generally not acceptable to designers. Moreover, designers prefer each well group to be as large as possible. However, this latter preference is in tension with the goal of any automated well layout system to minimize the well area utilized to receive the desired circuits.

It is, therefore, an object of the present invention to overcome the above problems and others by providing an automated method for creating well geometries for circuits, especially analog circuits. It is also an object of the present invention to minimize the area of the generated well geometry while, at the same time, avoiding overlap between the generated well geometry and one or more areas of an integrated circuit design where it is desired to avoid placing circuits or elements of a circuit. Still other objects will become apparent to those of ordinary skill in the art upon reading and understanding the following detailed description.

SUMMARY OF THE INVENTION

Accordingly, we have invented a method of creating a conformal outline for layout of one or more devices on an integrated circuit. The method includes defining a plurality of input rectangles in a Cartesian coordinate system having a first axis and second axis, with each input rectangle having two edges parallel to the first axis and two sides parallel to the second axis. Coordinates on the first axis where the sides of each input rectangle sides reside are acquired and a sorted list is formed from the acquired coordinates. A variable I is initialized with the value of two (2) and first and second candidate rectangles having one of their respective sides positioned at the smallest and largest coordinates in the sorted list, respectively, are identified from the input rectangles. The other of the sides of the respective first and second candidate rectangles are set equal to the coordinate on the first axis stored in the $I^{th}$ position in the sorted list, thereby forming a shared side. For each candidate rectangle having coordinates on the first axis which overlap coordinates of one or more input rectangles on the first axis, the lengths of the sides of the candidate rectangles are modified as necessary so that they extend from the maximum to the minimum second axis coordinates of the one or more input rectangles. If the shared side with respect to one candidate rectangle does not coincide with or overlap the shared side with respect to the other candidate rectangle, the length of the shared side with respect to the one candidate rectangle is modified as necessary so that it coincides with or overlaps the shared side with respect to the other candidate rectangle.

The method can also include the step of initializing a Best Solution variable that includes a cost.

The method can further include the steps of determining a cost of the candidate rectangles and, when the cost of the candidate rectangles is more advantageous then the cost of the Best Solution, updating the Best Solution with the position of the candidate rectangles in the Cartesian coordinate system and the cost determined therefor.

Next, the variable I is incremented by one (1) and a determination is made if I equals the number of coordinates in the sorted list. If not, the shared side is stepped or moved to the coordinate on the first axis stored in the $I^{th}$ position in the sorted list. For each candidate rectangle having coordinates on the first axis which overlap coordinates of one or more input rectangles on the first axis, the lengths of the sides of the candidate rectangle are modified as necessary so they extend from the maximum to the minimum second axis coordinates of the one or more input rectangles. If the shared side with respect to one candidate rectangle does not coincide with or overlap the shared side with respect to the other candidate rectangle, the length of the shared side with respect to one rectangle is modified as necessary so that it coincides with or overlaps the shared side with respect to the other candidate rectangle. Next, the cost of the candidate rectangles is determined and the Best Solution is updated with the position of the candidate rectangles and the cost therefor when the cost is more advantageous than the current cost of the Best Solution. The foregoing steps are repeated until the value of the variable I equals the number of coordinates in the sorted list.

The cost of the candidate rectangles can be determined in numerous manners. One manner of determining the cost includes defining one or more penalty rectangles in the Cartesian coordinate system and determining an area of intersection between the candidate rectangles and the one or more penalty rectangles. The cost of the candidate rectangles can be determined based on at least two of (i) the area of the candidate rectangles; (ii) the area of intersection; and (iii) a penalty weight (PW) for the intersection.

Preferably, the cost is determined utilizing the following equation:

$$\text{Cost} = (\text{Area of Candidate Rectangles}) + \sum_{k=0}^{k=A} PW_k *$$

$$\sum_{i=0}^{i=B} \text{Area of Intersection (Penalty Rects}_k, \text{ Candidate Rects}_i).$$

where A=(No. of Penalty Rects. −1); and

B=(No. of Candidate Rects. −1).

We have also invented a method of creating a conformal outline for layout of one or more devices on an integrated circuit that includes defining a plurality of input rectangles in a Cartesian coordinate system having a first axis and a second axis, where each input rectangle has two edges parallel to the first axis and two sides parallel to the second axis. Coordinates on the first axis are acquired where the sides of each input rectangle reside and a sorted list is formed from the acquired coordinates. A variable I is initialized to two (2). Next, first and second candidate rectangles having one of their respective sides positioned at the smallest and largest coordinates in the sorted list, respectively, are identified from the input rectangles and a third candidate rectangle having its sides positioned between the smallest and largest coordinates in the sorted list is also identified from the input rectangles. The side of the first candidate rectangle opposite the smallest coordinate in the sorted list and one side of the third candidate rectangle are set equal to the coordinate on the first axis stored in the $I^{th}$ position in the sorted list thereby forming a shared side. A variable J is initialized to the value of the variable I plus one (1), i.e., J=I+1. Next, the side of the second rectangle opposite the largest coordinate in the sorted list and the other side of the third candidate rectangle are set equal to the coordinate on the first axis stored in the $J^{th}$ position in the sorted list, thereby forming another shared side. For each candidate rectangle having coordinates on the first axis which overlap coordinates of one or more input rectangles on the first axis, the lengths of sides of the candidate rectangle are modified as necessary so they extend from the maximum to the minimum second axis coordinates of the one or more input rectangles. When the shared side with respect to one candidate rectangle does not coincide with or overlap the same shared side with respect to the other candidate rectangle, the length of the shared side with respect to the one candidate rectangle is modified as necessary so that it coincides with or overlaps the same shared side with respect to the other candidate rectangle.

The method can also include determining a cost of the candidate rectangles and, when the thus determined cost is more advantageous than a cost of a Best Solution variable, the Best Solution variable is updated with the coordinates of the candidate rectangles in the Cartesian coordinate system and the cost determined therefor.

The foregoing steps, after initialization of the variable J, are repeated until the value of J equals the number of coordinates in the sorted list. When the value of J equals the number of coordinates in the sorted list, the value of I is incremented by 1 and the foregoing steps, after identifying the first, second and third candidate rectangles from the input rectangles, are repeated until the value of I equals the number of coordinates in the sorted list minus one (1).

We have also invented a method of creating a conformal outline for layout of one or more devices on an integrated circuit that includes the steps of defining a plurality of input geometries in a coordinate system having a first axis and a second axis where each input geometry has first and second edges parallel to the first axis and first and second sides parallel to the second axis. Coordinates on the first axis are acquired where the sides of each input geometry reside. A sorted list is formed from these acquired coordinates. A first candidate geometry is identified having its first side residing at the smallest coordinate in the sorted list and a second candidate geometry is identified having its second side residing at the largest coordinate in the sorted list. The second side of the first candidate geometry and the first side of the second candidate geometry are positioned at a coordinate in the sorted list between the smallest and largest coordinates thereby forming a shared side.

For each candidate geometry which has first axis coordinates which overlap first axis coordinates of one or more input geometries, and which has at least one second axis coordinate extreme which does not coincide with a second axis coordinate extreme of the one or more input geometries, the lengths of the sides of the candidate geometry are modified so that opposite ends of each side terminate at the respective second axis coordinate extremes of the one or more input geometries. When the shared side with respect to one candidate geometry does not coincide with or completely overlap the shared side with respect to the other candidate geometry, the length of the shared side with respect to the one candidate geometry is modified so that it coincides with or completely overlaps the shared side with respect to the other candidate geometry.

The method can also include determining for the combination first and second candidate geometries a cost therefor. If the thus determined cost is more advantageous than a previously determined cost or no cost, the thus determined cost is stored along with the position of the first and second candidate geometries relative to the input geometries. The foregoing steps, after forming the shared side at a coordinate in the sorted list between the smallest and largest coordinates, are repeated for each position of the shared side at coordinates in the sorted list between the smallest and largest coordinates.

We have also invented a method of creating a conformal outline for layout of one or more devices on an integrated circuit that includes the steps of defining a plurality of input geometries in a coordinate system having a first axis and a second axis, where each input geometry has first and second edges parallel to the first axis and first and second sides parallel to the second axis. Coordinates on the first axis are acquired where the sides of each input geometry reside and a sorted list is formed of the acquired coordinates. A first candidate geometry is identified having its first side residing at the smallest coordinates in the sorted list and a second candidate geometry is identified having a second side residing at the largest coordinate in the sorted list. A third candidate geometry is also identified having its first and second sides residing between the smallest and largest coordinates in the sorted list. The second side of the first candidate geometry and the first side of the third candidate geometry are positioned at one coordinate in the sorted list between the smallest and largest coordinates in the sorted list thereby forming a first shared side. The second side of the third candidate geometry and the first side of the second candidate geometry are positioned at another coordinate in the sorted list between the one coordinate and the largest coordinate in the sorted list thereby forming a second shared side.

For each candidate geometry which has first axis coordinates which overlap first axis coordinates of one or more of the input geometries, and which has at least one second axis coordinate extreme which does not coincide with a second axis coordinate extreme of the one or more input geometries, the lengths of the sides of the candidate geometry are modified as necessary so that opposite ends of each side terminate at the respective second axis coordinate extremes of the one or more input geometries. When the shared side with respect to one candidate geometry does not coincide or completely overlap the shared side with respect to an adjacent candidate geometry, the length of the shared side with respect to the one candidate geometry is modified so that it coincides or completely overlaps the shared side with respect to the adjacent candidate geometry.

The method can also include determining a cost of the first, second and third candidate geometries and, if the thus determined cost is more advantageous than a previously determined cost or no cost, the thus determined cost is stored along with the positions of the first, second and third candidate geometries relative to the input geometries. The foregoing steps, after forming the second shared side, are repeated for each position of the second shared side at coordinates in the sorted list between the coordinate in the sorted list where the first shared side resides and the largest coordinate in the sorted list.

The method can further include repeating the foregoing steps, after forming the second shared side, for each position of the first shared side at coordinates in the sorted list between the one coordinate and the second from the largest coordinate in the sorted list.

Lastly, we have invented a method of creating a conformal outline for the layout of one or more devices on an integrated circuit. The method includes defining a plurality of adjoining candidate rectangles which encompass a plurality of input rectangles, where the outline of the adjoining rectangles define the conformal outline.

Preferably, each input rectangle has left and right sides, and top and bottom edges. Each candidate rectangle preferably has left and right sides, and top and bottom edges. Each pair of adjacent candidate rectangles define a shared side or edge that is coincident with the respective side or edge of at least one input rectangle.

The method can further include stepping each shared side or edge to at least one other side or edge, respectively, of one of the input rectangles and determining for each step of each shared side or edge a cost for the candidate rectangles. The outline of the candidate rectangles having the most advantageous cost is selected as the conformal outline.

The method can also include at least one of the following steps. First, for each step of each shared side, the lengths of the respective sides of at least the pair of candidate rectangles defining the shared side are adjusted whereupon the top and bottom edges of each pair of candidate rectangles are coincident with the topmost and bottommost edges of any input rectangles which overlap the candidate rectangle. Second, for each step of each shared edge, the lengths of the respective edges of at least the pair of candidate rectangles defining the shared edge are adjusted whereupon the left and right sides of each of the pair of candidate rectangles are coincident with the leftmost and rightmost sides of any input rectangles which overlap the candidate rectangle.

BRIEF DESCRIPTION OF THE DRAWINGS

FIGS. 3a–3f are a detailed flow diagram of the software routine shown in FIG. 1 that evaluates two and three candidate rectangle solutions for the array of input rectangles and penalty rectangles shown in FIG. 2;

DETAILED DESCRIPTION OF THE INVENTION

The present invention is a method for creating one or more solution geometries, such as solution rectangles, that cover a set of input geometries, such as input rectangles, in a conformal manner. The present invention is embodied in a computer software program which is called as a sub-routine from a main program. The software program essentially receives inputs regarding (i) input rectangles to be covered, (ii) rectangles to be avoided, and (iii) the maximum number of candidate rectangles to be used for a result. Based on these three inputs, the software program returns to the main program, or routine, one or more solution rectangles that cover the set of input rectangles in a conformal manner.

The invention will now be described with reference to the accompanying Figures where like reference numbers correspond to like elements. In accompanying FIGS. 2, 4a–4d and 6a–6h, the sides and edges of coordinate rectangles are shown offset from the sides and edges of certain input rectangles for purposes of illustration. However, it is to be appreciated that the sides and edges of the candidate rectangles overlap the sides and edges of certain input rectangles.

Figure 1:
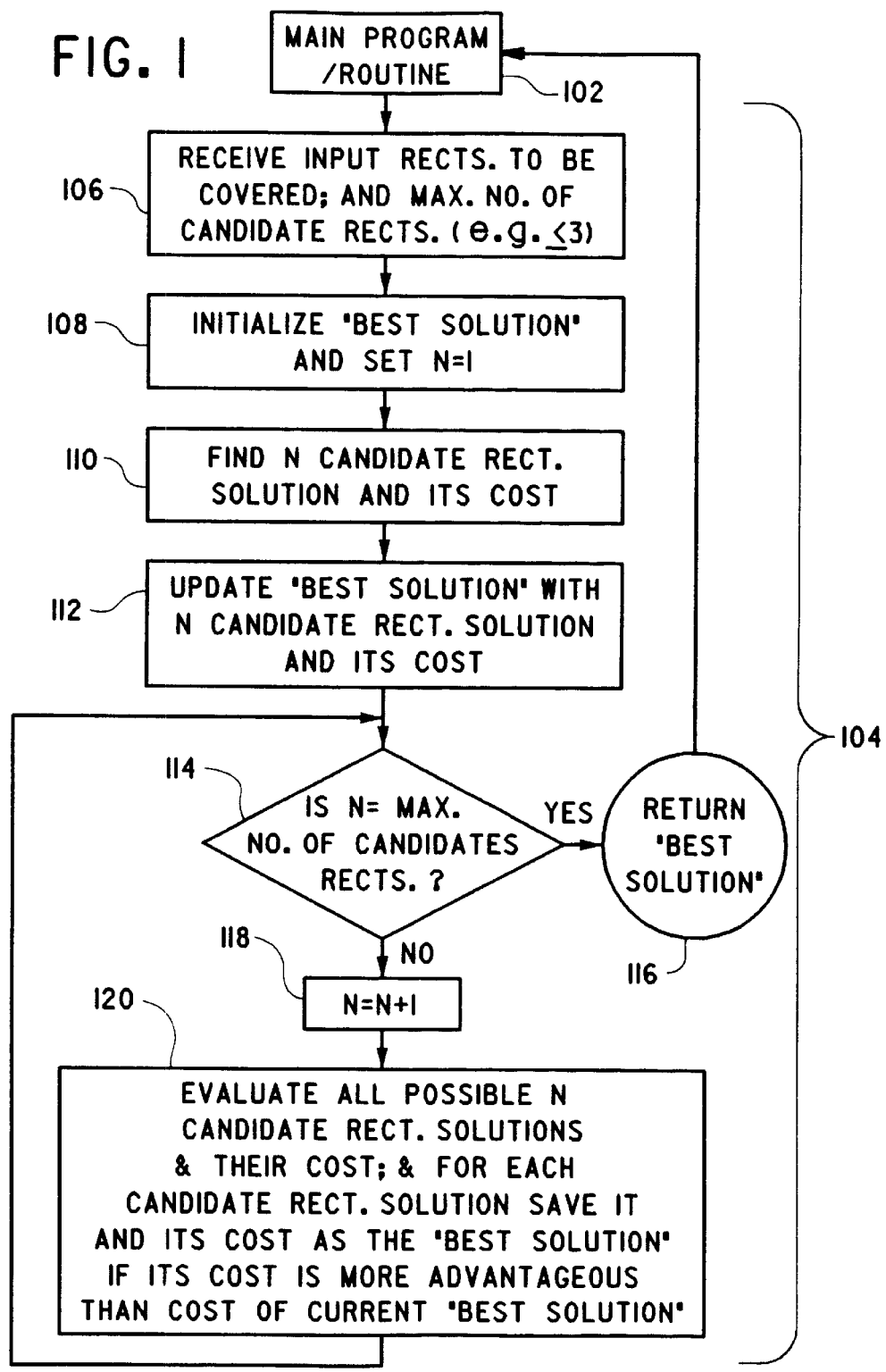
FIG. 1 is a top level flow diagram of the operation of a software program which implements a method in accordance with the present invention.

With reference to FIG. 1, a main program/routine 102 initiates a call to a sub-routine software program 104 which implements the method of the present invention. Software program 104 includes routine 106 which receives the three basic inputs, namely, the input rectangles to be covered, the rectangles to be avoided, and the maximum number of candidate rectangles to be used for a result. Program flow then advances to routine 108 which initializes a "Best Solution" variable and sets a variable N equal to 1. Next, program flow advances to routine 110 which finds the N candidate rectangle solution and its cost. Since at this time N equals 1, routine 110 finds a one candidate rectangle solution and the cost of this solution.

Figure 2:
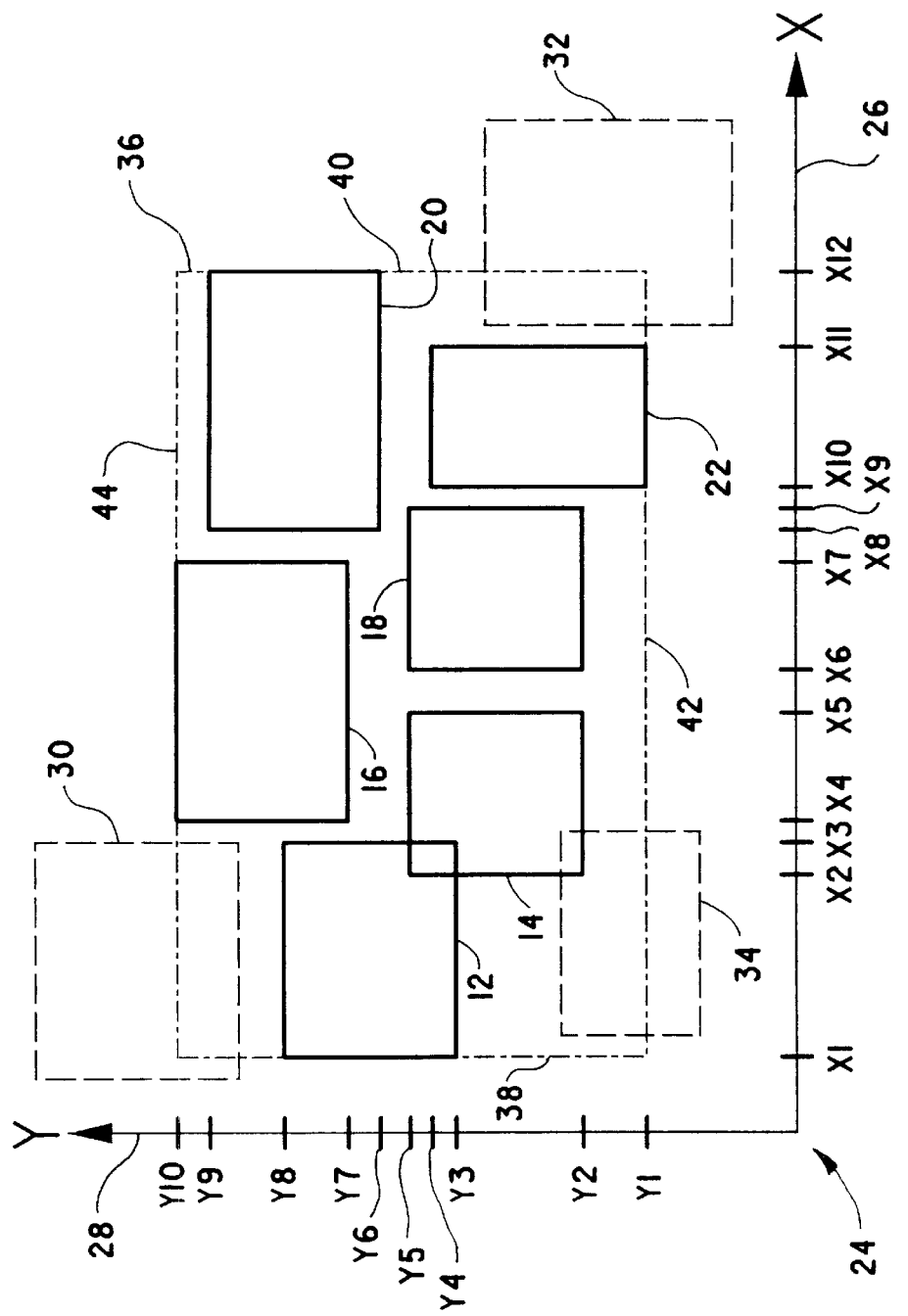
FIG. 2 is a one candidate rectangle solution for an array of input rectangles and penalty rectangles received in a Cartesian coordinate system.

With reference to FIG. 2 and with continuing reference to FIG. 1, routine 110 finds the one rectangle solution by superimposing a plurality of input rectangles 12, 14, 16, 18, 20 and 22, i.e., the input rectangles to be covered, in a Cartesian coordinate system 24 having a first X axis 26 and a second Y axis 28. Each input rectangle 12–22 has top and bottom edges parallel to X axis 26 and left and right sides parallel to Y axis 28. Routine 110 also superimposes one or more penalty rectangles 30, 32, and 34, i.e., the rectangles to be avoided, in Cartesian coordinate system 24. The positions of input rectangles 12–22 relative to the positions of penalty rectangles 30–34 are received in routine 106. Each penalty rectangle 30–34 can have an overlapping or nonoverlapping relationship with each other or with one or more input rectangles 12–22 and vice versa.

Next, a minimum X axis coordinate x1 where a side of one of the input rectangles, e.g., input rectangle 12, resides; a maximum X axis coordinate x12 where a side of one of the input rectangles, e.g., input rectangle 20, resides; the minimum Y axis coordinate y1 where an edge of one of the input rectangles, e.g., input rectangle 22, resides; and the maximum Y axis coordinate y10 where an edge of one of the input rectangles, e.g., input rectangle 16, resides are determined. Next, a candidate rectangle 36 is defined in Cartesian coordinate system 24 with its left side 38 and its right side 40 positioned at the smallest X axis coordinate x1 and the largest X axis coordinate x12, respectively, of input rectangles 12–22. Candidate rectangle 36 also has its bottom edge 42 and its top edge 44 positioned at the smallest Y axis coordinate y1 and the largest Y axis coordinate y10, respectively, of input rectangles 12–22.

Next, the cost of this one candidate rectangle solution, i.e., the cost of candidate rectangle 36, is determined. Preferably, this cost is determined utilizing the following equation (1):

$$\text{Cost} = (\text{Area of Candidate Rectangle(s)}) + \sum_{k=0}^{k=A} PW_k *$$

$$\sum_{i=0}^{i=B} \text{Area of Intersection (Penalty Rect(s)}_k, \text{ Candidate Rect(s)}_i).$$

where A=(No. of Penalty Rects. −1);
B=(No. of Candidate Rects. −1); and
PW=(Penalty Weight).

The invention, however, is not to be construed as limited to utilizing equation (1) to determine the cost of candidate rectangle solution(s).

As can be seen from equation (1), the cost of an N-candidate rectangle solution is determined as a function of the area of the candidate rectangle(s), and the area of intersection between the candidate rectangle(s) and the penalty rectangle(s). In addition, a penalty weight (PW) is associated with the area of intersection so that the significance of the area of intersection to the determination of the cost of the solution can be regulated as desired.

Once the cost of candidate rectangle 36 is determined, software program 104 advances to routine 112 which updates the Best Solution variable with the position of candidate rectangle 36 relative to input rectangles 12–22 and the cost of this solution. Next, in routine 114, the current value of the variable N is compared to the maximum number of candidate rectangles received in routine 106. For the purpose of describing the invention, it will be assumed that the maximum number of candidate rectangles that can be received in routine 106 is three (3). However, this is not to be construed as limiting the invention.

If the current value of the variable N equals the maximum number of candidate rectangles, program flow advances to routine 116 which returns the Best Solution variable and, more particularly, the position of the candidate rectangle(s) relative to the input rectangles to main program/routine 102 for further processing. However, if the current value of the variable N does not equal the maximum number of candidate rectangles, program flow advances to routine 118 where the value of the variable N is incremented by one (1).

Next, program flow advances to routine 120 where all possible N-candidate rectangle solutions and their costs are evaluated. For each N-candidate rectangle solution, the position of the candidate rectangles relative to the input rectangles and the cost of the solution are saved in the Best Solution variable if the cost of the solution is less than the cost of the solution currently saved in the Best Solution variable. In other words, the current value of the Best Solution variable is replaced by the N-candidate rectangle solution having a more advantageous, e.g., lower, cost.

More specifically, and with reference to FIGS. 3a–3f, and 4a–4d, routine 120 includes step 201 which acquires the coordinates on the X axis 26 where the sides of each input rectangle 12–22 reside. Program flow then advances to step 202 which forms a sorted list of the acquired X axis coordinates. For example, in FIG. 4a, input rectangle 12 has its sides residing at X axis coordinates x1 and x3; input rectangle 14 has its sides positioned at X axis coordinates x2 and x5; input rectangle 16 has its sides positioned at X axis coordinates x4 and x7; input rectangle 18 has its sides positioned at X axis coordinates x6 and x9; input rectangle 20 has its sides positioned at X axis coordinates x8 and x12; and input rectangle 22 has its sides positioned at X axis coordinates x10 and x11. Once X axis coordinates x1–x12 are acquired, they are sorted, preferably in order from smallest to largest, i.e., from x1 to x12, to form a sorted list of X axis coordinates.

Next, in step 204, the left edge of a first candidate rectangle 46 is assigned to the first X axis coordinate x1 in the sorted list. Then, in step 206, the right edge of a second candidate rectangle 48 is assigned to the last coordinate x12 in the sorted list.

Program flow then advances to step 208 where a variable I is assigned a value of two (2). Next, in step 209, a determination is made whether the current value of the variable N equals to the maximum number of candidate rectangles. If not, program flow advances to step 210 which assigns the right side of candidate rectangle 46 and the left side of candidate rectangle 48 to the coordinate stored in the $I^{th}$ position in the sorted list thereby forming a shared or adjoining side 49. In this case, since I is equal to two (2), shared side 49 is positioned at X axis coordinate x2. Program flow then advances to step 212.

Figure 4A:
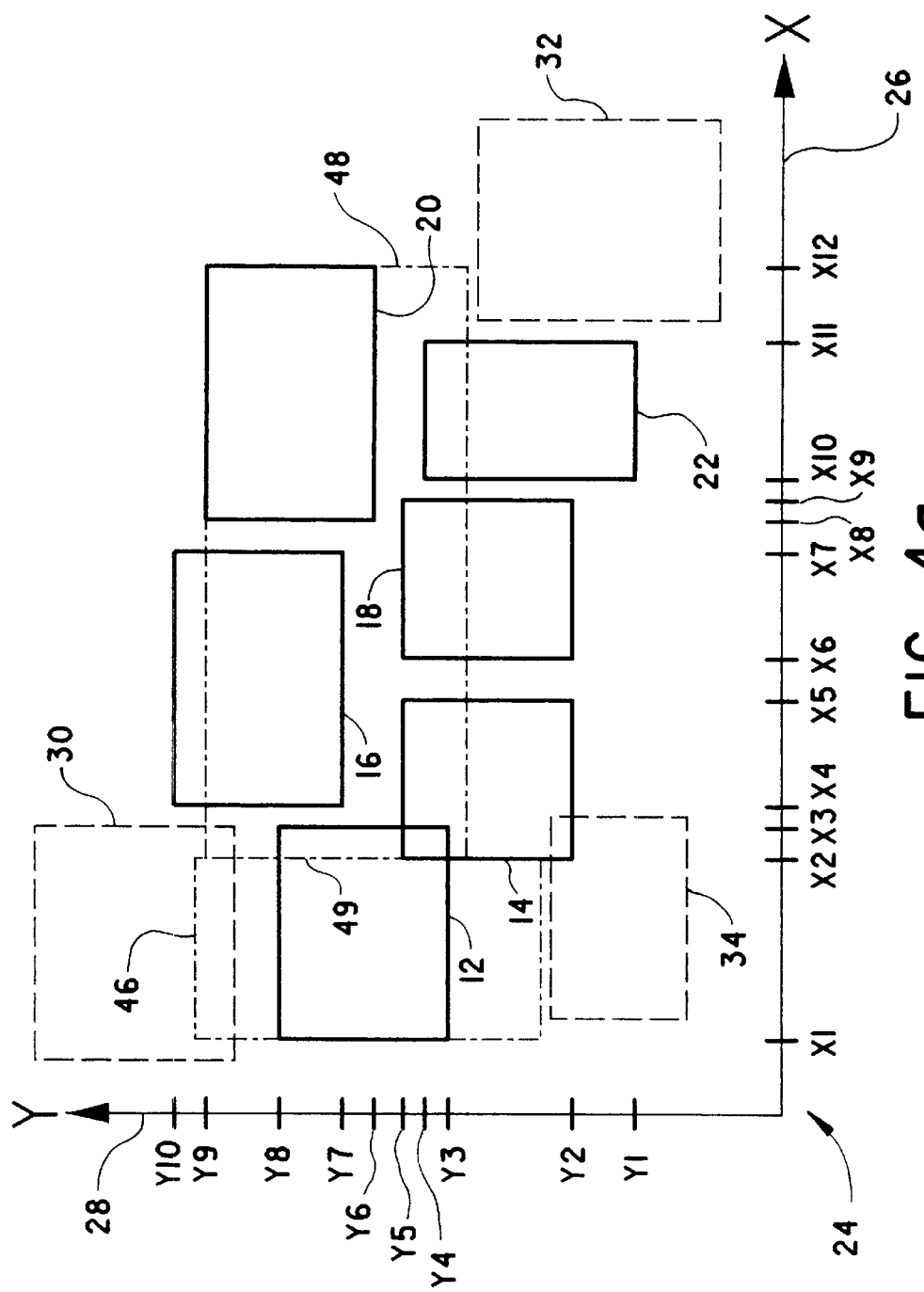
FIGS. 4a–4c show a portion of the X-axis two-candidate rectangle solution implemented in the part of the flow diagram shown in FIGS. 3a–3c.
Figure 4B:
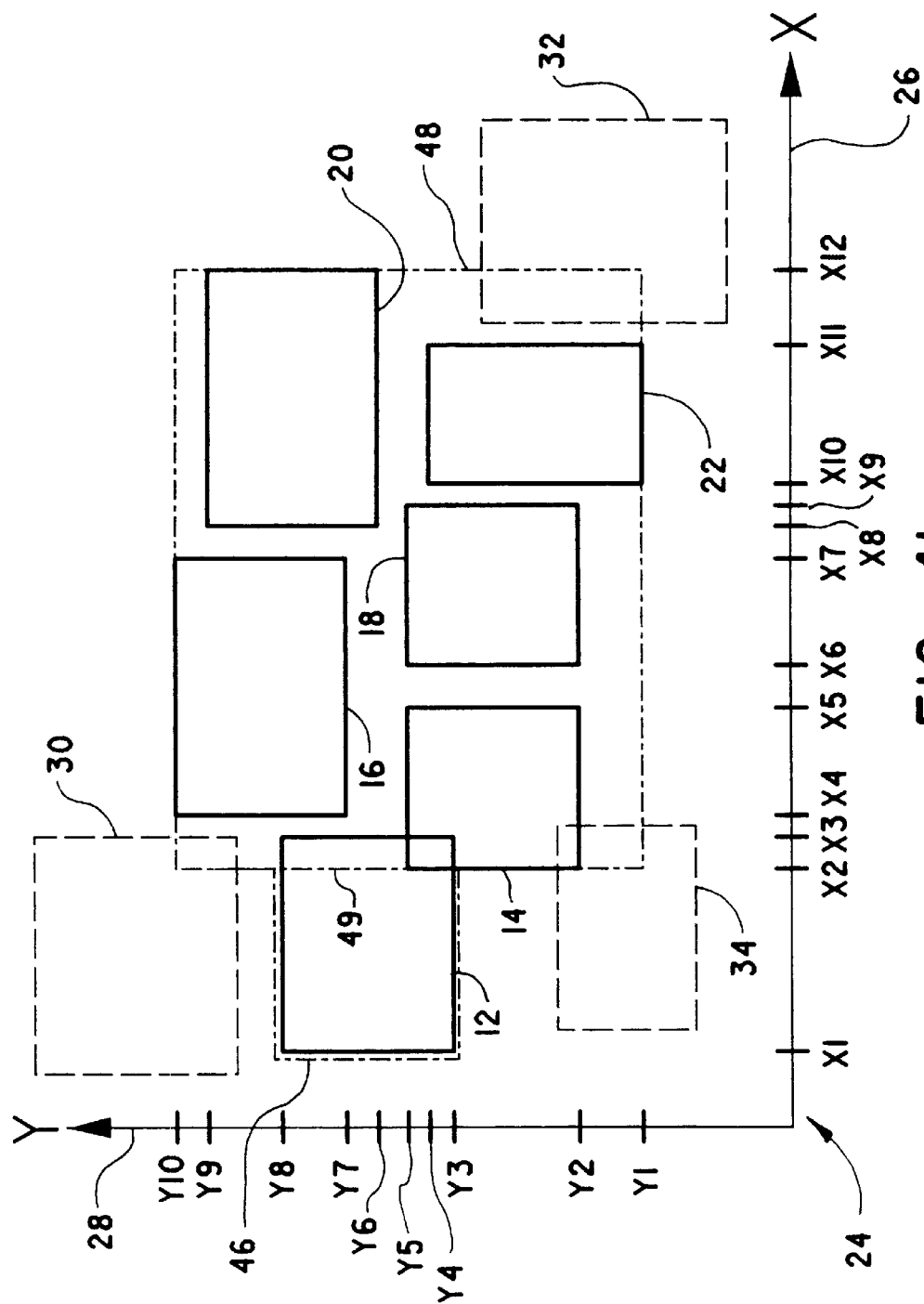

In step 212, the top and bottom edges of each candidate rectangle 46 and 48 are set equal to the maximum and minimum Y axis values, i.e., the Y axis coordinate extremes, of any input rectangle 12–22 having X axis coordinates which overlap X axis coordinates of the candidate rectangle. For example, as shown in FIG. 4b in contrast to FIG. 4a, the lengths of the left and right sides of candidate rectangle 46 are adjusted so that the bottom and top edges of candidate rectangle 46 are positioned at Y axis coordinates y3 and y8 where the bottom and top edges, respectively, of input rectangle 12 reside. Similarly, the lengths of the sides of candidate rectangle 48 are adjusted so that the bottom and top edges of candidate rectangle 48 are positioned at Y axis coordinates y1 and y10 where the bottom edge of input rectangle 22 and the top edge of input rectangle 16, respectively, reside. Program flow then advances to step 214.

In step 214, the position of the top and/or bottom edges of one or more of candidate rectangles 46 and 48 are modified as necessary so that shared side 49 with respect to one candidate rectangle, e.g., candidate rectangle 48, coincides with or completely overlaps shared side 49 with respect to the other candidate rectangle, e.g., candidate rectangle 46. Candidate rectangles 46 and 48 shown in FIG. 4b meet all the conditions set forth in step 214 and therefore require no modification of the position of their top and/or bottom edges. Examples where the top and/or bottom edges of a pair of candidate rectangles 50 and 52 require repositioning are shown in FIGS. 5a–5c.

Figure 5A:
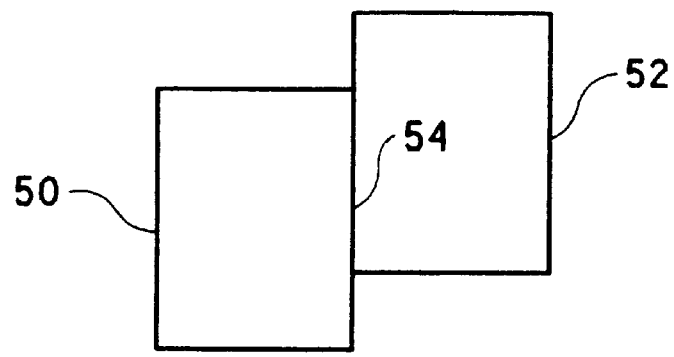
FIGS. 5a–5c show the process in step 214 of FIG. 3a of adjusting the top and/or bottom edges of at least one candidate rectangle so that a shared side of one candidate rectangle coincides or overlaps the same shared side with respect to another candidate rectangle.
Figure 5B:
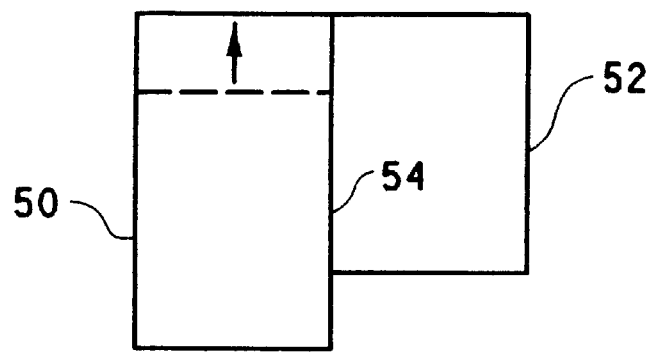
Figure 5C:
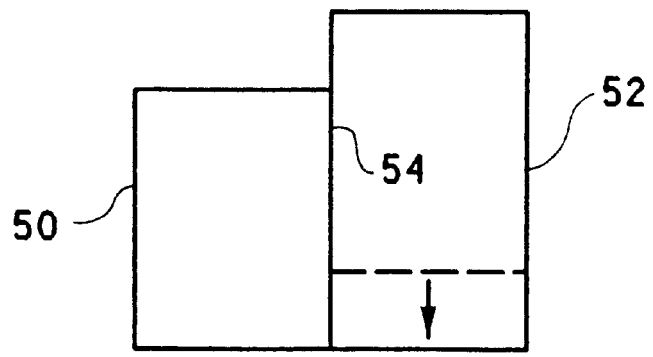

In FIG. 5a, candidate rectangles 50 and 52 have a shared side 54. As can be seen, shared side 54 with respect to candidate rectangle 50 does not coincide with or completely overlap shared side 54 with respect to candidate rectangle 52, and vice versa. To meet this requirement in step 214, the lengths of the sides of candidate rectangle 50 can be extended upward, as shown in FIG. 5b, so that the top edges of candidate rectangles 50 and 52 are aligned. Alternatively, as shown in FIG. 5c, the lengths of the sides of candidate rectangle 52 can be extended downward so that the bottom edges of candidate rectangles 50 and 52 are aligned. The decision to reposition the top edge of candidate rectangle 50 or the bottom edge of candidate rectangle 52 can be based on, among other things, the avoidance of overlap with a penalty rectangle, the avoidance of overlap with another candidate rectangle, and a minimization of the additional area to be added by such repositioning. However, other criteria can also be utilized. It can be seen that the modified candidate rectangles 50 and 52 shown in FIGS. 5b and 5c, respectively, meet all the conditions set forth in step 214, namely, that adjacent candidate rectangles 50 and 52 share a side 54 and that the shared side 54 of one rectangle 50 or 52 coincides with or overlaps the shared side 54 of the other rectangle 52 or 50.

Referring back to FIGS. 3a–3f and 4a–4d, program flow then advances to step 216 where the cost of candidate rectangles 46 and 48 is determined utilizing equation (1) above. If the cost of candidate rectangles 46 and 48 is less than the current cost saved in the Best Solution variable, the positions of candidate rectangles 46 and 48 relative to input rectangles 12–22 and the cost of this solution are saved in the Best Solution variable.

Program flow then advances to step 217 where a determination is made if the value of variable N equals the maximum number of candidate rectangles. If not, program flow advances to step 218 where the variable I is incremented by one (1). Program flow then advances to step 220 where a determination is made whether the current value of the variable I equals the number of X axis coordinates in the sorted list. If not, program flow returns to step 210. Steps 210–220 are then repeated until the variable I equals the number of X axis coordinates in the sorted list.

Figure 4C:
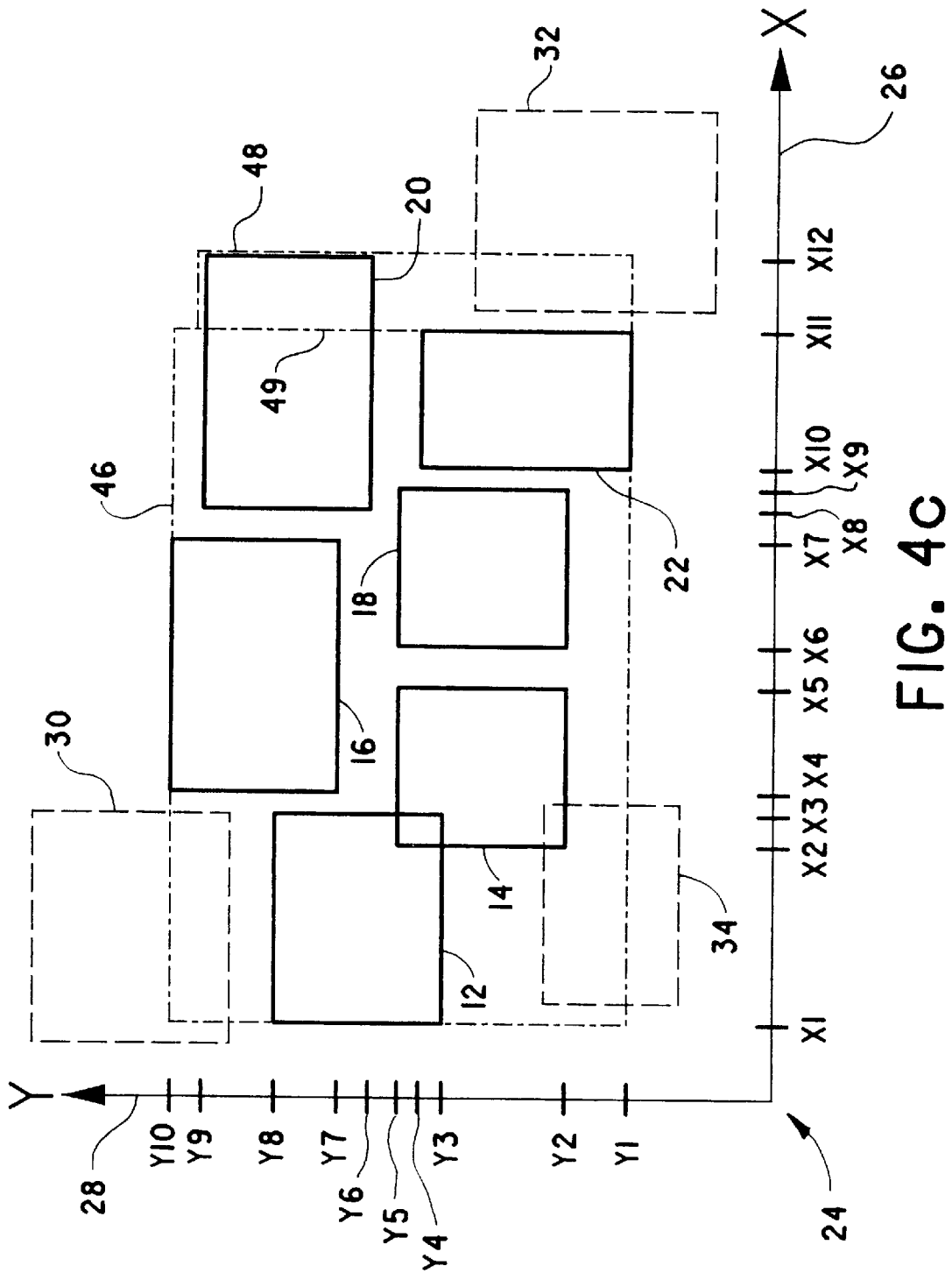

Repeating steps 210–220 for each value of the variable I has the effect of sequentially stepping shared side 49 to each X axis coordinate in the sorted list from X axis coordinate x2, shown in FIG. 4b, to X axis coordinate x11, shown in FIG. 4c. For each position of shared side 49 at an X axis coordinate in the sorted list, adjustment of the position of the top and/or bottom edges of candidate rectangles 46 or 48 in accordance with the requirements of steps 212 and 214 is repeated and the cost of candidate rectangles 46 and 48 is determined. If any thus determined cost is more advantageous, e.g., less than, the current cost saved in the Best Solution variable, the positions of candidate rectangles 46 and 48 relative to input rectangles 12–22 and the cost of this solution are saved in the Best Solution variable.

When shared side 49 has been stepped to each X axis coordinate between the first and last X axis coordinates, the same process is repeated for a shared edge stepped to each Y axis coordinate between the first and last Y axis coordinates. More specifically, when step 220 determines that the value of the variable I equals the number of X axis coordinates in the sorted list, program flow advances to step 221 in FIGS. 3d–3f. Steps 221–240 are essentially the same steps as steps 201–220, respectively, except that steps 221–240 are for two candidate rectangles having a shared edge positioned at Y axis coordinates between the first and last Y coordinates in a sorted list of Y coordinates of input rectangles 12–22. An example of candidate rectangles 56 and 58 having a shared or adjoining edge 60 positioned at Y axis coordinate y2 is shown in FIG. 4d. Steps 230–240 sequentially step shared edge 60 to each Y axis coordinate in the sorted list of Y axis coordinates between Y axis coordinates y1 and y10 in the same manner as steps 210–220 step shared edge 49 to each X axis coordinate in the sorted list of X axis coordinates between X axis coordinates x1 and x12. For each position of shared edge 60 between Y axis coordinates y1 and y10, steps 232–236 are repeated.

In step 232, the left and right sides of each candidate rectangle are set equal to the maximum and minimum X axis values, i.e., the X axis coordinate extremes, of any input rectangle having its Y axis coordinates overlapping the Y axis coordinates of the candidate rectangle.

In step 234, the position of the right and/or left sides of at least one candidate rectangle are modified as necessary so that shared edge 60 with respect to one candidate rectangle, e.g., 56, coincides with or overlaps shared edge 60 with respect to the other candidate rectangle, e.g., 58.

In step 236, the cost of first and second candidate rectangles 56 and 58 for each position of shared side 60 at a Y axis coordinate between Y axis coordinates y1 and y10 is determined and saved, along with the corresponding position of first and second candidate rectangles 56 and 58 relative to input rectangles 12–22, in the Best Solution variable if the thus determined cost is less than the cost currently saved in the Best Solution variable.

Figure 3C:
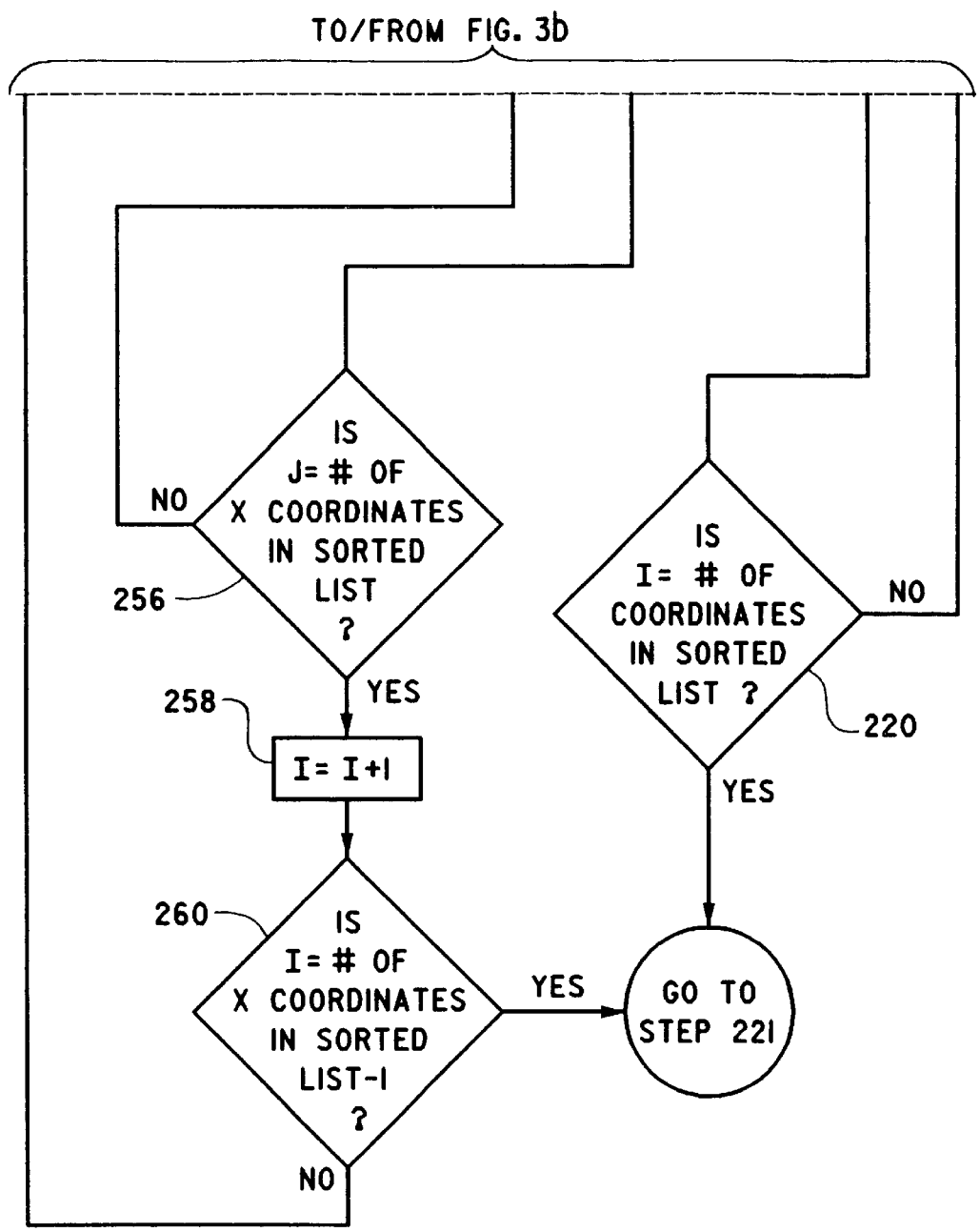
Figure 3D:
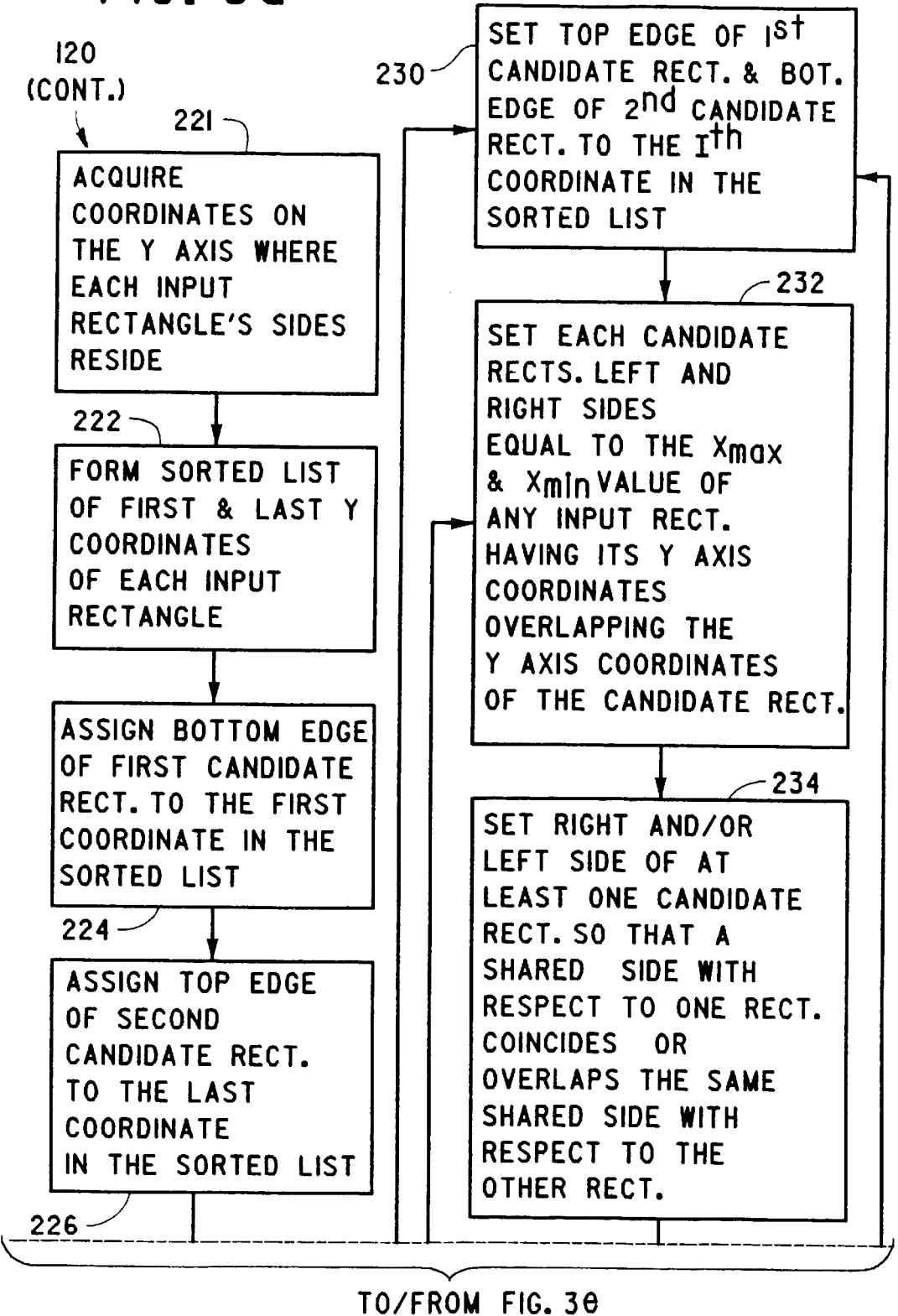
Figure 3E:
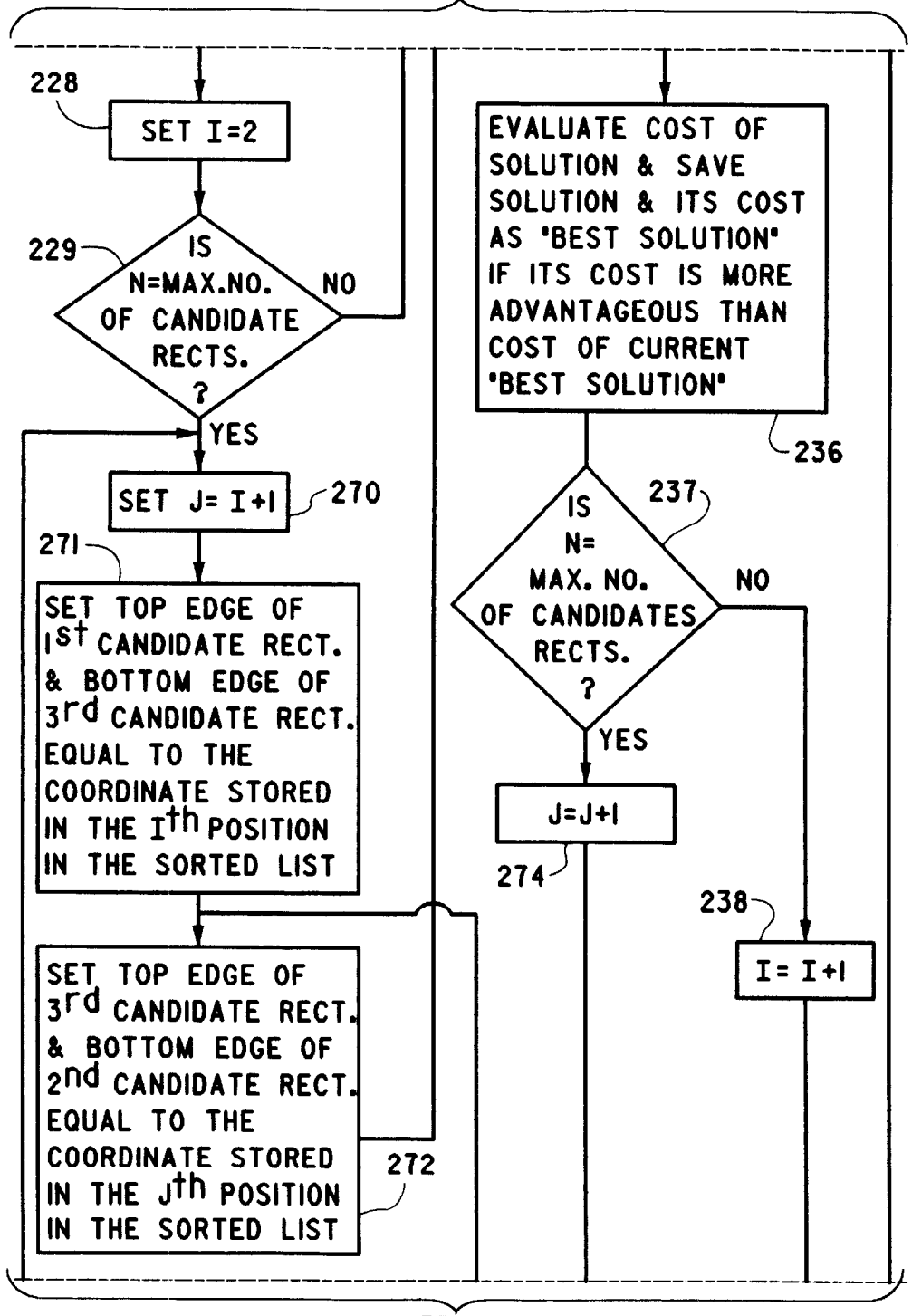
Figure 3F:
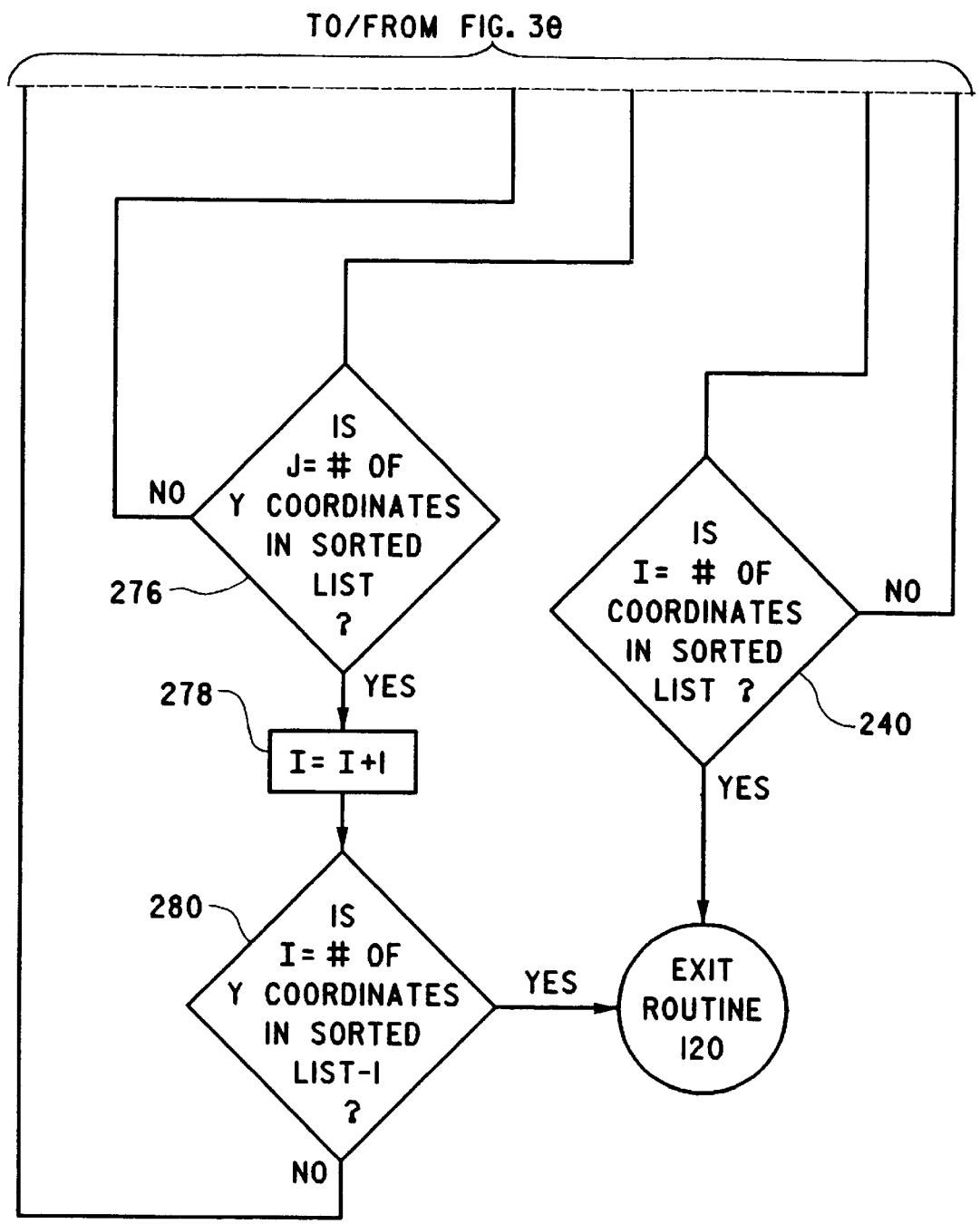
Figure 4D:
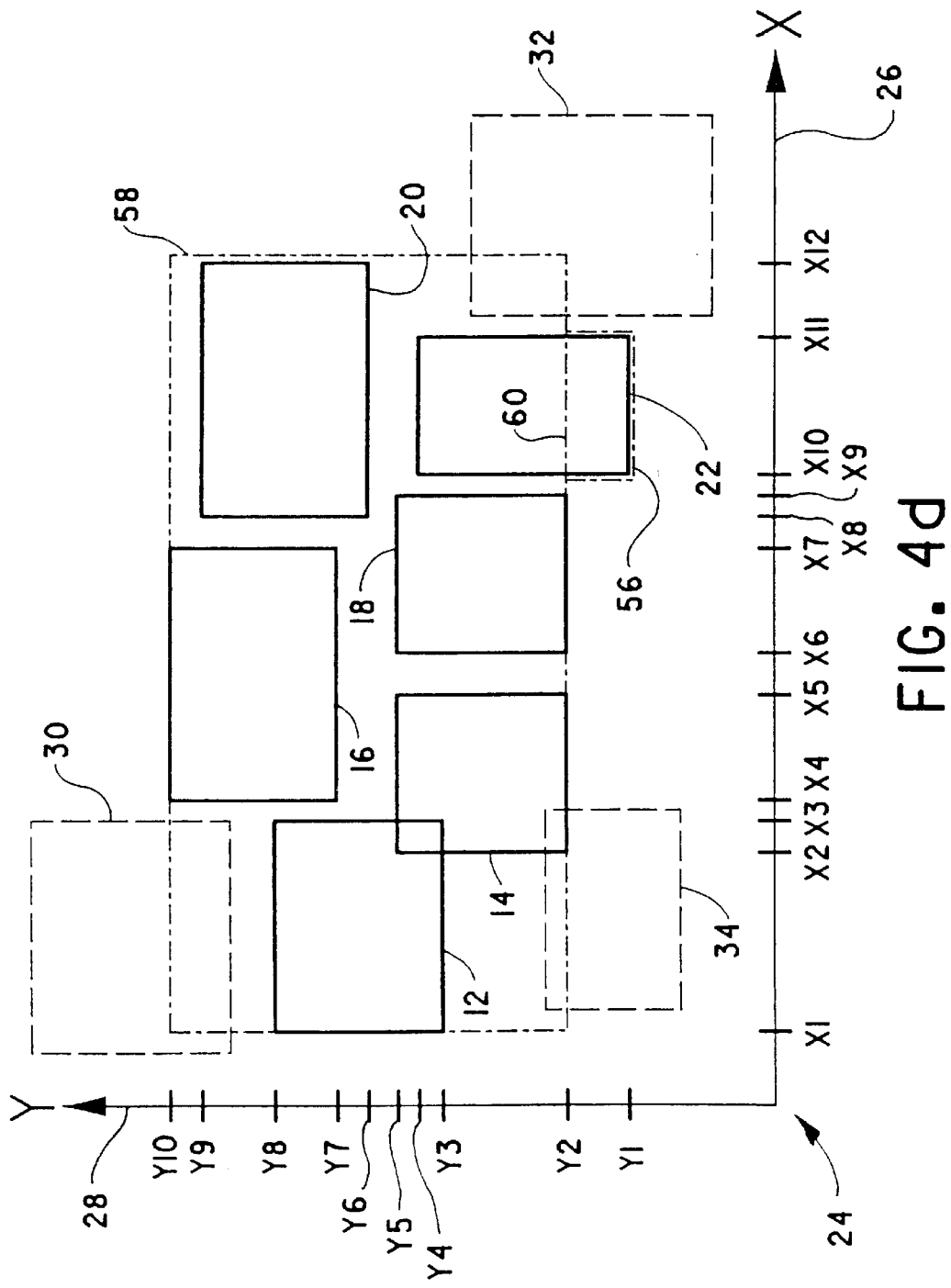
FIG. 4d shows the starting Y-axis two-candidate rectangle solution for the part of the flow diagram shown in FIGS. 3d–3f.

Referring back to FIG. 1 and with continuing reference to FIGS. 3d–3f, when step 240 determines that the value of the variable I equals the number of Y coordinates in the sorted list of Y coordinates, all of the steps associated with routine 120 for all two candidate rectangle solutions are complete and program flow returns to routine 114 which determines if the variable N equals the maximum number of candidate rectangles. If not, program flow advances to routine 118 where the value of the variable N is incremented by one (1), i.e., N=3. Program flow then advances to routine 120 for evaluation of all three candidate rectangle solutions.

In this iteration, routine 120 executes steps 201–209, 212–220, 221–228, and 232–240 discussed above. In addition, since the variable N equals the maximum number of candidate rectangles, i.e., 3, routine 120 further executes steps 250–260 shown in FIGS. 3a–3c and steps 270–280 shown in FIGS. 3d–3f. These steps will now be described with reference to FIGS. 6a–6h for all 3-candidate rectangle solutions.

With specific reference to FIGS. 3a–3f and 6a–6h, routine 120 initially performs step 201 which acquires the coordinates on X axis 26 where the sides of each input rectangle 12–22 reside. Program flow then advances to step 202 which forms a sorted list of the X axis coordinates. Program flow then advances to step 204 where the left edge of a first candidate rectangle 62 is assigned to the first X axis coordinate x1 in the sorted list. Next, in step 206 the right edge of a second candidate rectangle 64 is assigned to the last coordinate x12 in the sorted list. In step 208 the variable I is set equal to 2 and in step 209 a determination is made whether the variable N equals the maximum number of candidate rectangles. Since, in this iteration of routine 120, the variable N equals the maximum number of candidate rectangles, i.e., 3, program flow advances to step 250 where a variable J is set equal to the current value of the variable I plus one (1), i.e., J=I+1. Program flow then advances to step 252.

In step 252, the right side of first candidate rectangle 62 and the left side of a third candidate rectangle 66 are set equal to the coordinate stored in the $I^{th}$ position in the sorted list to form a shared or adjoining side 68. In addition, the right side of third candidate rectangle 66 and the left side of second candidate rectangle 64 are set equal to the coordinates stored in the $J^{th}$ position in the sorted list thereby forming a shared or adjoining side 70. In this iteration of step 252, I is equal to two (2) and J is equal to three (3). Thus, shared sides 68 and 70 are positioned at X axis coordinates x2 and x3, respectively. Program flow then advances to step 212, bypassing step 210.

Figure 6A:
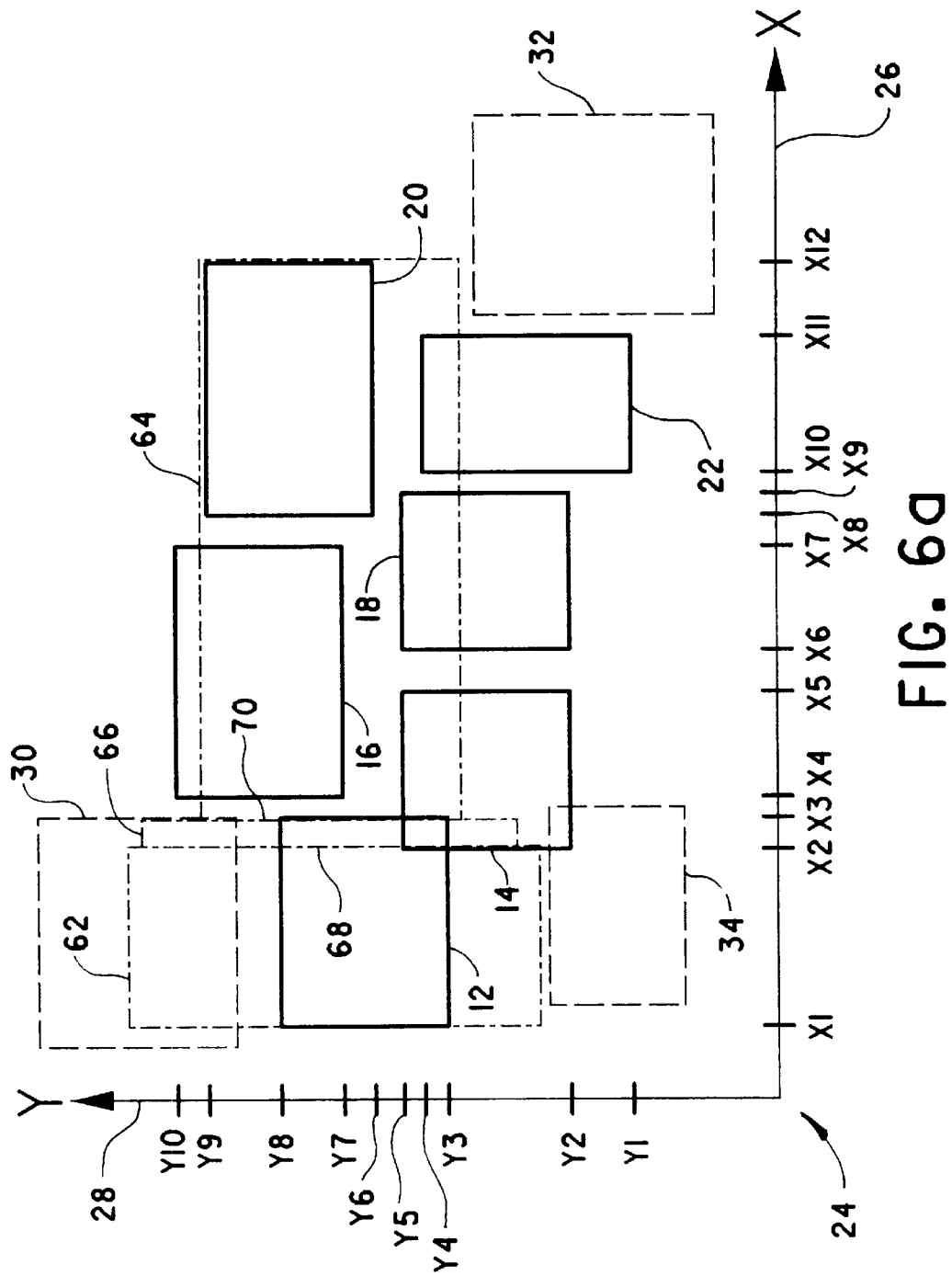
FIGS. 6a–6f show part of the X-axis three-candidate rectangle solution implemented by the part of the flow diagram shown in FIGS. 3a–3c.
Figure 6B:
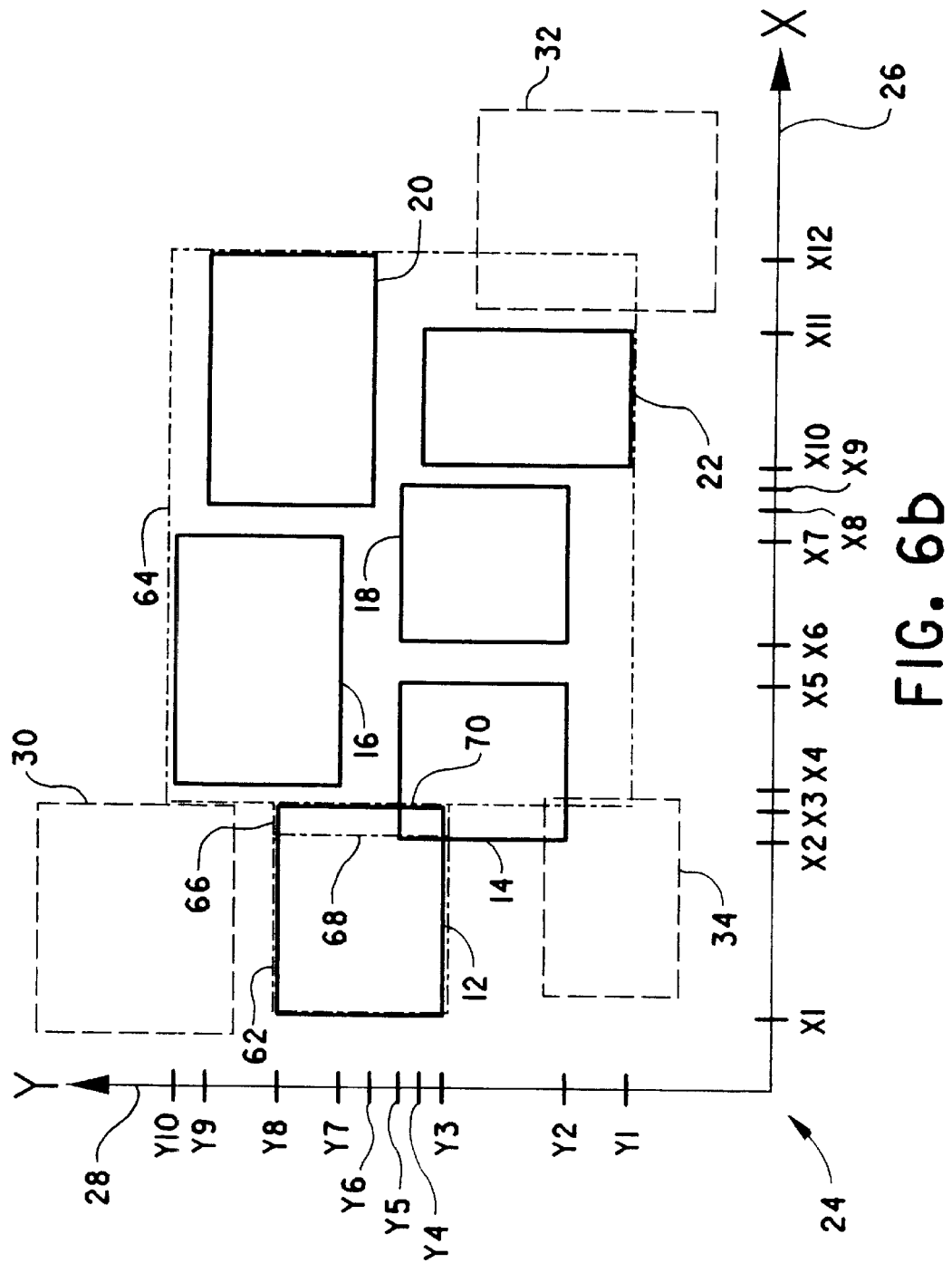
Figure 6C:
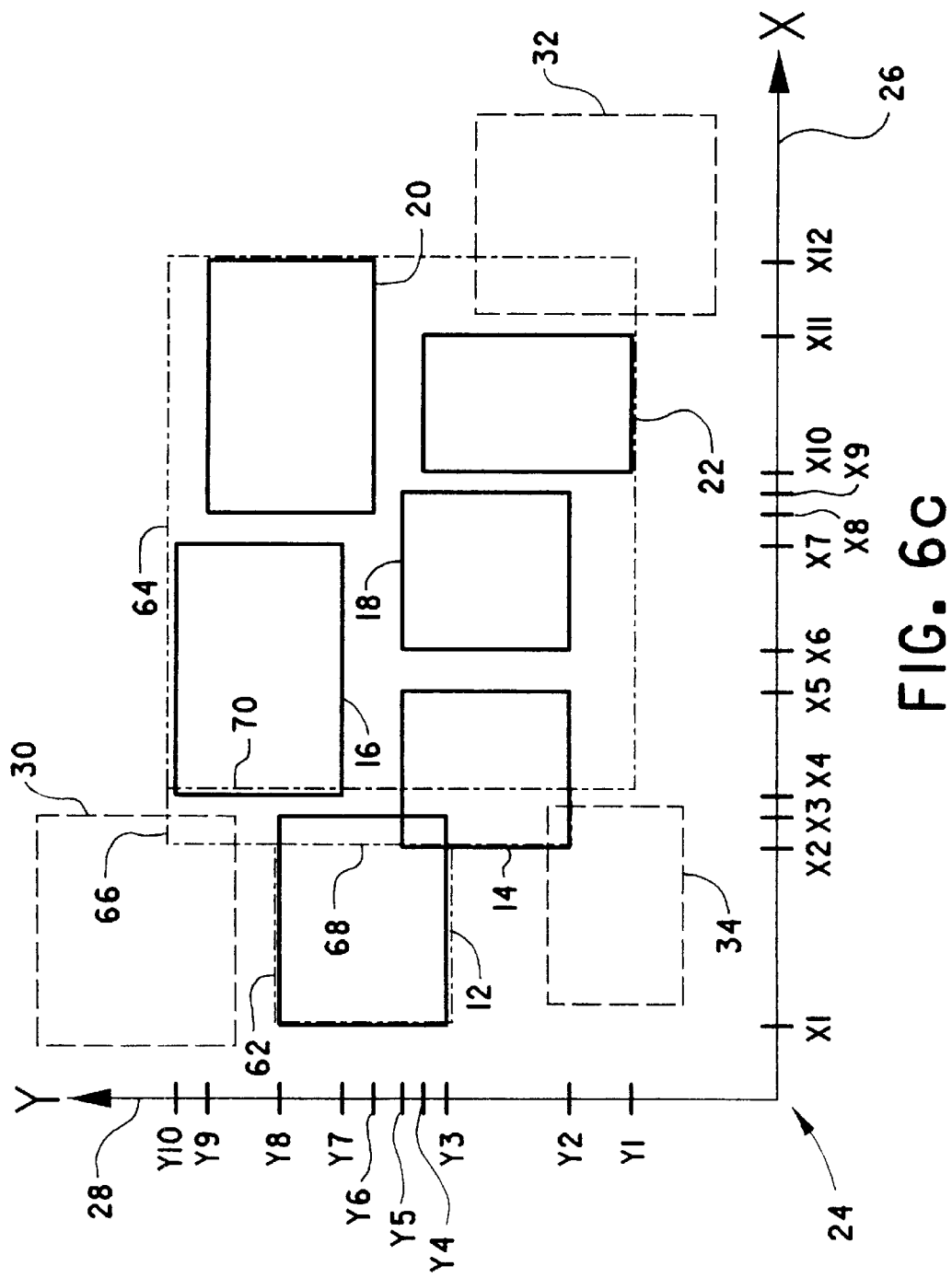

In step 212, the top and bottom edges of each candidate rectangle 62, 64 and 66 are set equal to the maximum and the minimum Y axis values, i.e., the Y axis coordinate extremes, of each input rectangle 12–22 having its X axis coordinates overlapping the X axis coordinates of candidate rectangle 62, 64 or 66. For example, as shown in FIG. 6b in contrast to FIG. 6a, the lengths of the sides of candidate rectangle 62 are adjusted so that the bottom and top edges of candidate rectangle 62 are positioned at Y axis coordinates y3 and y8, respectively, where the bottom and top edges of input rectangle 12 reside. Similarly, the lengths of the sides of candidate rectangle 66 are adjusted so that the bottom and top edges of candidate rectangle 66 are positioned at Y axis coordinates y2 and y8 where the bottom edge of input rectangle 14 and the top edge of input rectangle 12, respectively, reside. Furthermore, the lengths of the sides of candidate rectangle 64 are adjusted so that the bottom and top edges of candidate rectangle 64 are positioned at Y axis coordinates y1 and y10 where the bottom edge of input rectangle 22 and the top edge of input rectangle 16, respectively, reside.

In step 214, the position of the top and/or bottom edges of at least one candidate rectangle 62, 64 or 66 are modified as necessary so that each shared side 68 and 70 with respect to one candidate rectangle coincides or completely overlaps the same shared side 68 and 70 with respect to the other candidate rectangle. In FIG. 6b, shared side 68 with respect to candidate rectangle 66 completely overlaps shared side 68 with respect to candidate rectangle 62, and shared side 70 with respect to candidate rectangle 64 completely overlaps shared side 70 with respect to candidate rectangle 66. Therefore, no modification of the position of the top and/or bottom edges of candidate rectangle 62, 64 or 66 is required.

Program flow then advances to step 216 where the cost of candidate rectangles 62, 64 and 66 is determined utilizing equation (1) above. If the cost of candidate rectangles 62, 64 and 66 is less than the current cost saved in the Best Solution variable, the position of candidate rectangles 62, 64 and 66 relative to input rectangles 12–22 and the cost of this solution are saved in the Best Solution variable.

Program flow then advances to step 217 which determines if the variable N equals the maximum number of candidate rectangles, i.e., 3. In this iteration of step 217, the value of the variable N equals the maximum number of candidate rectangles and program flow advances to step 254 where the variable J is incremented by one (1). Program flow then advances to step 256 which determines if the value of variable J equals the number of X coordinates in the sorted list. If not, program flow advances to step 252.

For this iteration of step 252, the variable I is equal to two (2) and the variable J is equal to four (4). In step 252, shared side 68 remains positioned at the $I^{th}$ position in the sorted list. In this case, since the value of the variable I has not changed since the prior iteration of step 252, shared side 68 remains at X axis coordinate x2. However, in this iteration of step 252, the position of shared side 70 is set equal to the $J^{th}$ position in the sorted list. Since the value of the variable J equals four (4), shared side 70 steps from X axis coordinate x3 in the previous iteration of step 252, shown in FIG. 6b, to X axis coordinate x4 for the current iteration of step 252, shown in FIG. 6c.

Program flow then advances to step 212 where the top and bottom edges of each candidate rectangle 62, 64 and 66 are set equal to the maximum and minimum Y axis values of any input rectangle 12–22 having its X axis coordinates overlapping the X axis coordinates of the candidate rectangle.

Program flow then advances to step 214 where the position of the top and/or bottom edges of one or more of candidate rectangles 62, 64 and 66 are modified as necessary so that each shared side 68 and 70 with respect to one candidate rectangle coincides or completely overlaps the same shared side 68 or 70 with respect to the other candidate rectangle. Candidate rectangles 62, 64 and 66 shown in FIG. 6c meet all of the conditions set forth in steps 212 and 214 and therefore require no modification of the positions of their top and/or bottom edges.

Program flow then advances to step 216 where the cost of candidate rectangles 62, 64 and 66 is determined utilizing equation (1) above. If the thus determined cost is less than the current cost saved in the Best Solution variable, the position of candidate rectangles 62, 64 and 66 relative to input rectangles 12–22 and the cost of this solution are saved in the Best Solution variable. Program flow then advances to step 217 where a determination is made whether the value of the variable N equals the maximum number of candidate rectangles. In this iteration of step 217, the variable N equals the maximum number of candidate rectangles. Thus, program flow advances to step 254 where the value of the variable J is incremented by one (1). In step 256 a determination is made if the value of the variable J equals the number of X coordinates in the sorted list. In this iteration, the variable J equals five, which is less than the number of X coordinates in the sorted list, e.g., 12. Since the variable J does not equal the number of X coordinates in the sorted list, program flow advances to step 252 where the position of shared side 70 is stepped to the next X axis coordinate, i.e., X axis coordinate x5, in the sorted list.

Sequentially repeating steps 252, 212, 214, 216, 217, 254 and 256 for each value of the variable J has the effect of sequentially stepping shared side 70 from X axis coordinate x3 to X axis coordinate x11, while, at the same time, shared side 68 remains positioned at X axis coordinate x2. For each position of shared side 70 at an X axis coordinate in the sorted list, the process of adjusting the top and bottom edges of candidate rectangles 62, 64 or 66 in accordance with the requirements of steps 212 and 214 is repeated. In addition, the cost of candidate rectangles 62, 64 and 66 for each position of shared side 70 at an X axis coordinate in the sorted list is determined and stored, along with the position of candidate rectangles 62, 64 and 66 relative to input rectangles 12–22, in the Best Solution variable if the thus determined cost is less than the current cost stored in the Best Solution variable.

Figure 6D:
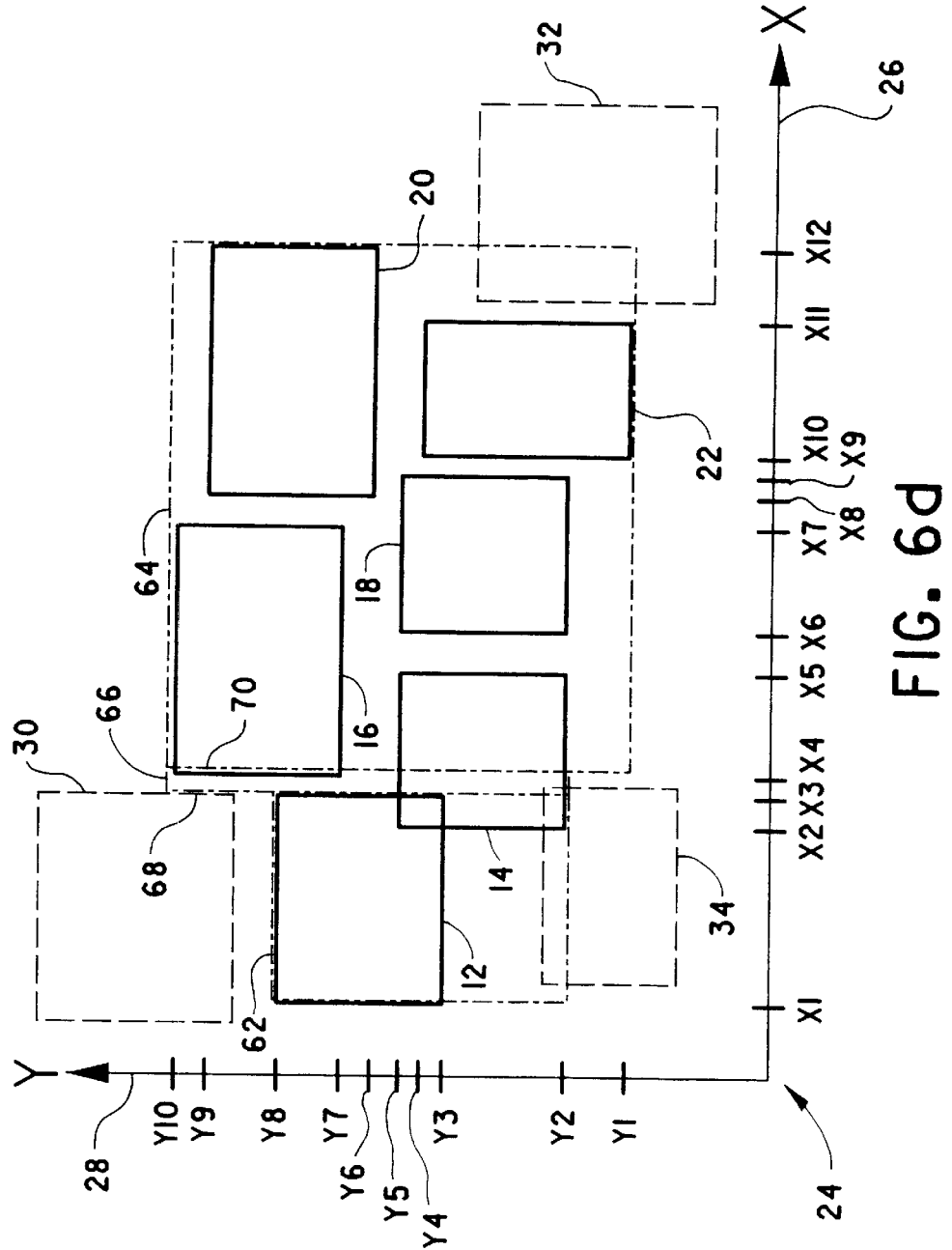

With reference to FIG. 6d and with continuing reference to FIGS. 3a–3c, when step 256 determines that the variable J equals the number of X coordinates in the sorted list, e.g., 12, program flow advances to step 258 where the variable I is incremented by one (1). During the first iteration of step 258, the variable I is set equal to 3. Program flow then advances to step 260 where a determination is made whether the value of the variable I equals the number of X coordinates in the sorted list minus one, i.e., 11. Stated differently, in step 260, a determination is made if the value of the variable I is equal to one less than the number of X coordinates in the sorted list. If not, program flow advances to step 250 where the variable J is set equal to the current value of the variable I plus one, i.e., J=I+1. In this iteration, since the variable I equals three (3), the variable J equals four (4). Program flow then step 251, shared side 68 is positioned at the X axis coordinate stored in the I$^{th}$ position in the sorted list. In this iteration of step 251, since the value of I is equal to three (3), shared side 68 is stepped from X axis coordinate x2 to X axis coordinate x3.

Program flow then advances to step 252 where shared side 70 is positioned at the X axis coordinate stored in the J$^{th}$ position in the sorted list. In this iteration of step 252, since J equals four (4), shared side 70 is stepped to X axis coordinate x4. Steps 252, 212, 214, 216, 217, 254 and 256 are then sequentially repeated until the variable J equals the number of coordinates in the sorted list. Sequentially repeating steps 252, 212, 214, 216, 217, 254 and 256 for each value of the variable J has the effect of stepping shared side 70 from X axis coordinate x4 to X axis coordinate x11 while shared side 68 remains positioned at X axis coordinate x3.

Figure 6E:
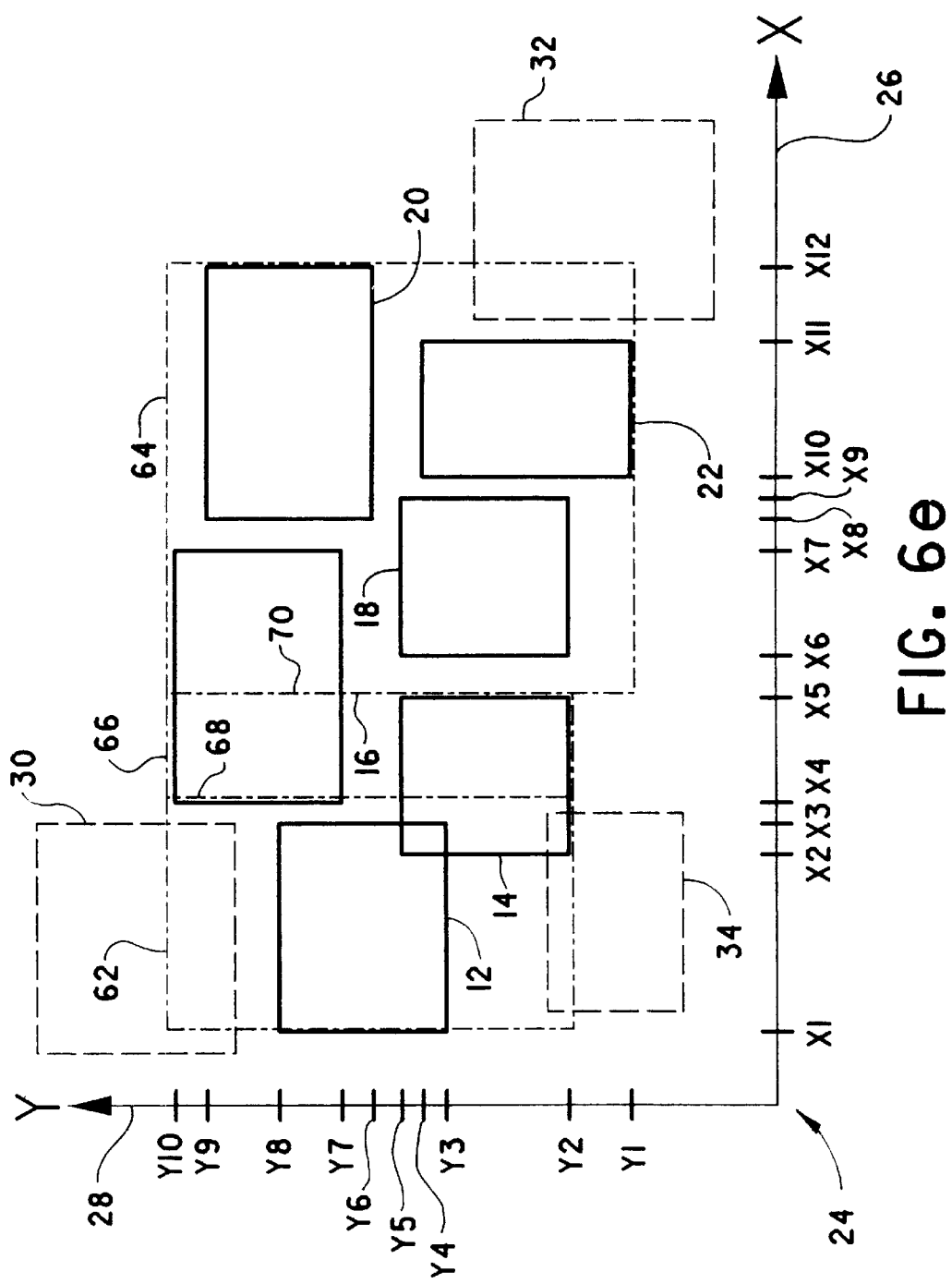

With reference to FIG. 6e and with continuing reference to FIG. 6d, each time step 256 determines that the variable J equals the number of X coordinates in the sorted list, steps 258, 260, 250 and 251 are executed. Each repetition of steps 258, 260, 250 and 251 has the effect of stepping shared side 68 from its current X axis coordinate, e.g., x3, to each X axis coordinate in the sorted list of X axis coordinates, up to and including X axis coordinate x10.

For each position of shared side 68 at an X axis coordinate from its current X axis coordinate to X axis coordinate x10, steps 252, 212, 214, 216, 217, 254 and 256 are sequentially repeated until the variable of J equals the number of coordinates in the sorted list. Since the value of the variable I will always be less than the value of the variable J, each repetition of steps 252, 212, 214, 216, 217, 254 and 256 has the effect of stepping shared side 70 to each X axis position in the sorted list between the current X axis position of shared side 68 and X axis coordinate x12. Thus, when shared side 68 is positioned at X axis coordinate x4, shared side 70 is stepped from X axis coordinate x5 to X axis coordinate x11. For each position of shared side 70 at an X axis coordinate in the sorted list between its current X axis coordinate and X axis coordinate x11, the process of adjusting the top and/or bottom edges of candidate rectangle 62, 64 and 66 in accordance with steps 212 and 214 and the determination of the cost thereof in accordance with step 216 is made. If, for any position of shared sides 68 and 70 at X axis coordinates in the sorted list, step 216 determines that the cost thereof is more advantageous than the current cost stored in the Best Solution variable, the position of candidate rectangles 62, 64 and 66 relative to input rectangles 12–22 and the cost of this solution are saved in the Best Solution variable.

Figure 6F:
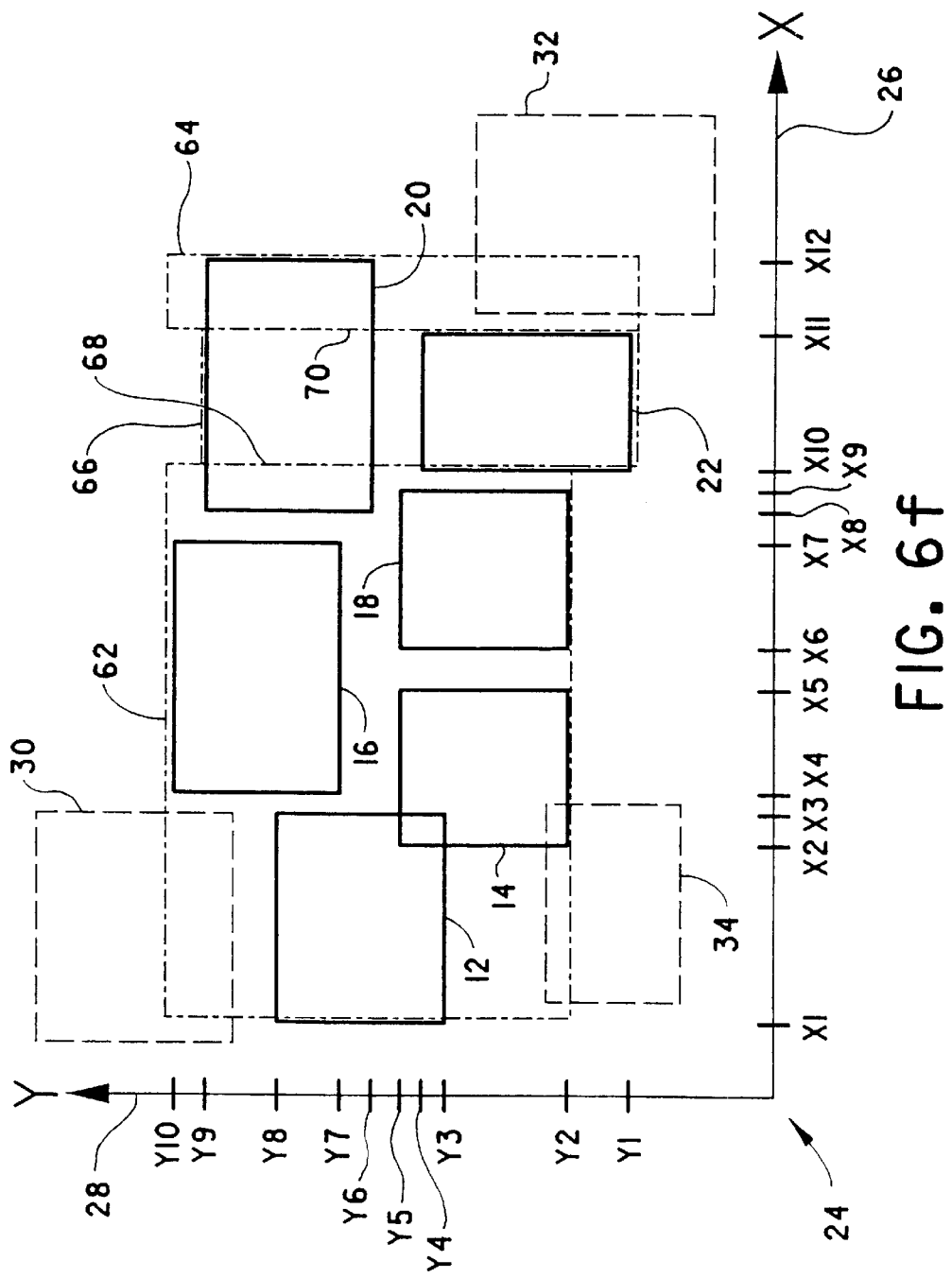

The process of sequentially stepping shared side 68 from X axis coordinate x2 to X axis coordinate x10, wherein for each position of shared side 68 the position of shared side 70 is stepped through each X axis coordinate between the current X axis coordinate position of shared side 68 and X axis coordinate x12, continues until shared side 68 is positioned at X axis coordinate x10 and shared side 70 is positioned at X axis coordinate x11. As shown in FIG. 6f, when shared sides 68 and 70 are positioned at X axis coordinates x10 and x11, respectively, no further stepping of shared sides 68 or 70 to another next X axis coordinate in the sorted list is possible while at the same time maintaining the integrity of candidate rectangles 62, 64 and 66.

As discussed above, for each position of shared side 68 and 70, the position of the top and/or bottom edges of one or more candidate rectangles 62, 64 and 66 are modified as necessary in accordance with steps 212 and 214. Thereafter, the cost of candidate rectangles 62, 64 and 66 for each position of shared sides 68 and 70 are determined and stored, along with the position of candidate rectangles 62, 64 and 66 relative to input rectangles 12–22, in the Best Solution variable if the thus determined cost is more advantageous, e.g., less than, the current cost stored in the Best Solution variable.

Figure 6G:
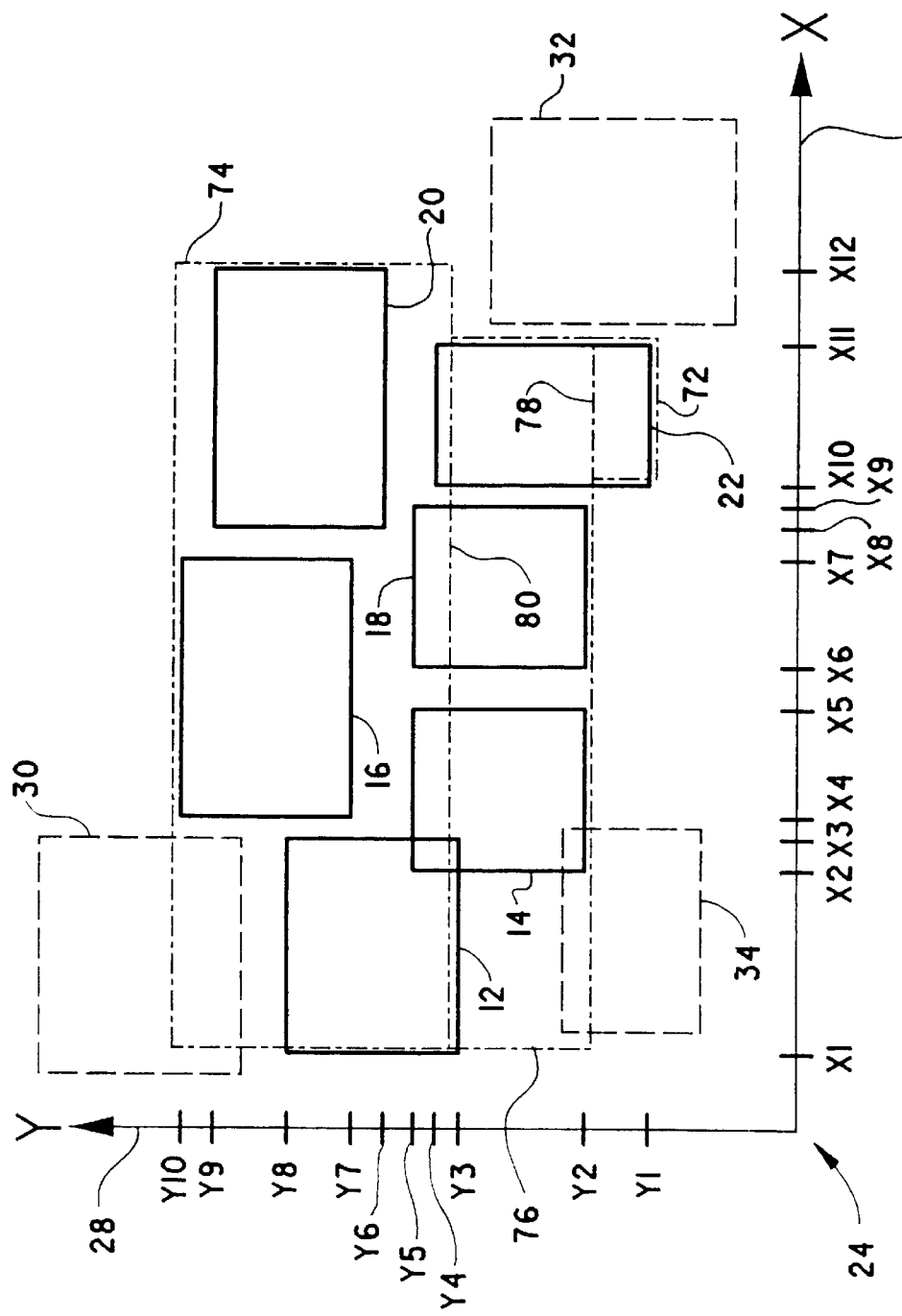
FIGS. 6g and 6h show the starting and ending Y-axis three-candidate rectangle solution implemented by the part of the flow diagram shown in FIGS. 3d–3f.

When shared sides 68 and 70 have been stepped to the positions shown in FIG. 6f, the same process is repeated for two shared edges stepped through the Y axis coordinates between the first and last Y axis coordinates. More specifically, with reference to FIGS. 3d–3f and with continuing reference to FIGS. 3a–3c, when step 260 determines that the value of the variable I equals one less than the number of X coordinates in the sorted list, program flow advances to step 221. As discussed above, steps 221–240 are essentially the same as steps 201–220, respectively. In addition, steps 270–280 are essentially the same as steps 250–260, respectively, except that three candidate rectangles 72, 74 and 76 have shared or adjoining edges 78 and 80 that are stepped to Y axis coordinates of input rectangles 12–22 along the Y axis. More specifically, candidate rectangles 72, 74 and 76 have shared edges 78 and 80 initially positioned at Y axis coordinates y2 and y3, respectively, as shown in FIG. 6g. Executing steps 222–237 and 270–280 in the order shown FIGS. 3d–3f has the effect of stepping shared side 78 from Y axis coordinate y2 to Y axis coordinate y8, where for each position of shared side 78 at one of these Y axis coordinates, shared side 80 is stepped through each Y axis coordinate between the current position of shared side 78 and Y axis coordinate y9.

For each position of shared sides 78 and 80 at Y axis coordinates in the sorted list, the left and right sides of candidate rectangles 72, 74 and 76 are adjusted in accordance with steps 232 and 234. Step 232 is similar to step 212 except that the position of the left and right sides of each candidate rectangle 72, 74 and 76 are set equal to the minimum and maximum X axis values, i.e., the X axis extremes, of any input rectangle 12–22 having its Y axis values overlapping the Y axis values of the candidate rectangle. Likewise, step 234 is similar to step 214 except that the position of the left and right sides of each candidate rectangle 72, 74 and 76 are modified as necessary so that shared side 78 or 80 with respect to one candidate rectangle coincides or completely overlaps the same shared side 78 or 80 with respect to the other candidate rectangle. Step 236 is similar to step 216 which stores the position of candidate rectangles 72, 74 and 76 relative to input rectangles 12–22 and the cost of candidate rectangles 72, 74 and 76 in the Best Solution variable if the thus determined cost is more advantageous, e.g., less than, the current cost stored in the Best Solution variable.

Figure 6H:
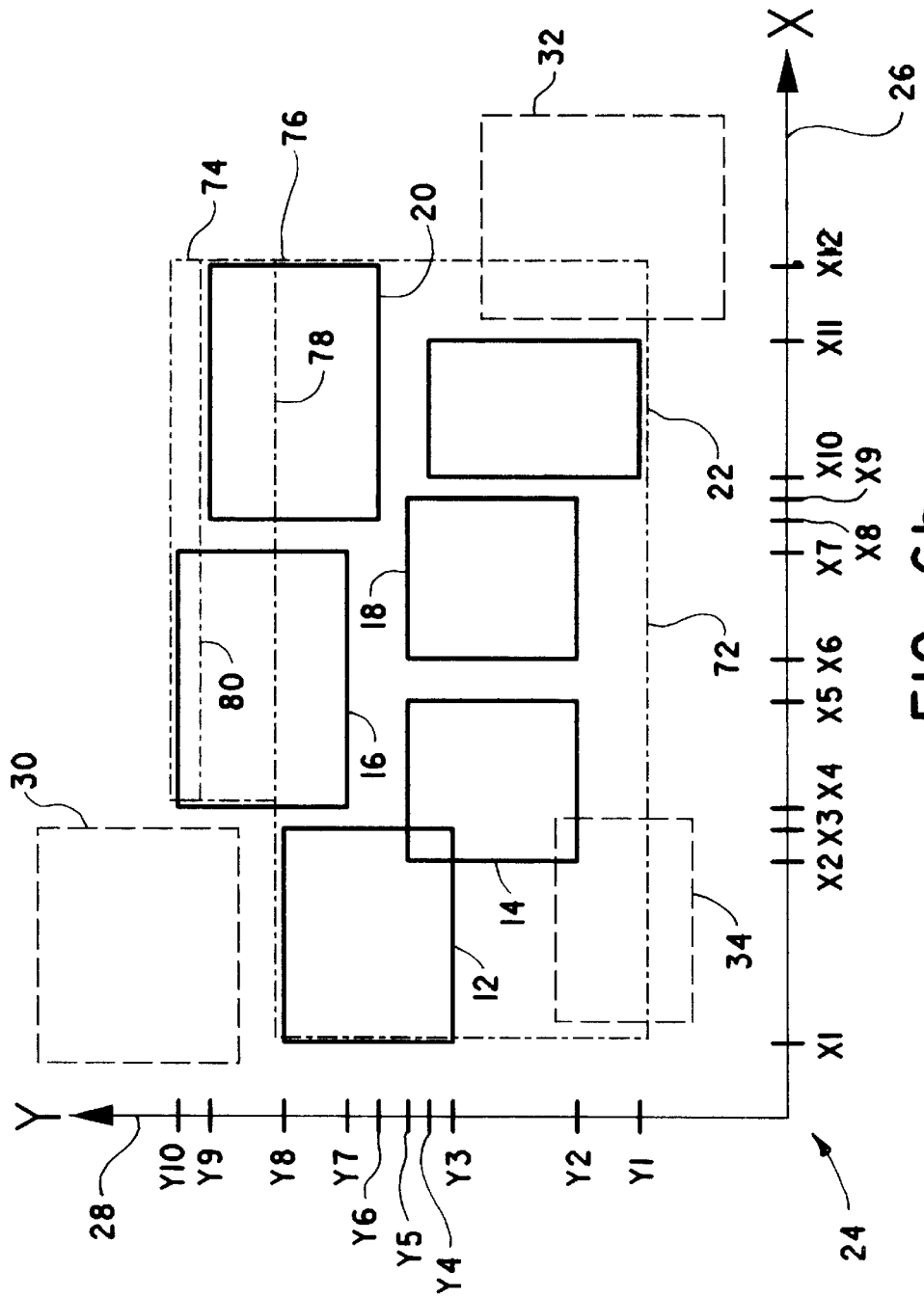

With reference to FIG. 6h, when the value of the variable N equals the maximum number of solution rectangles, e.g., 3, steps 221–237 and 270–280 are executed in the order shown in FIGS. 3d–3f until shared edges 78 and 80 are positioned at Y axis coordinates y8 and y9, respectively. When step 280 determines that the value of I equals one less than the number of Y coordinates in the sorted list, program flow exits routine 120 and advances to routine 114 in FIG. 1. When routine 114 determines that the variable N equals the maxumum number of solution rectangles, in this case 3, program flow advances to routine 116 which returns the positions(s) of the candidate rectangle(s) relative to input rectangles 12–22 having the most advantageous, e.g., least, cost to main program/routine 102 for processing. The candidate rectangle(s) returned to main program/routine 102 are also referred to as the solution rectangle(s). In the foregoing example, the most advantageous cost is the least cost. However, this is not to be construed as limiting the invention.

Main program/routine 102 utilizes the outline of the solution rectangle(s) as the conformal outline for the layout of one or more analog or digital devices, such as transistors, on an integrated circuit in a manner known in the art.

The invention has been described with reference to the preferred embodiment. Obvious modifications and alterations will occur to others upon reading and understanding the preceding detailed description. For example, the maximum number of candidate rectangle solutions can be increased to four or more provided that the above described method is adapted to account for this increase in the maximum number of candidate rectangles to be processed. To this end, the number of shared sides for four or more candidate rectangles solutions and the movement of these shared sides needs to be coordinated in the manner described above for the shared sides of the three (3) candidate rectangle solution. It is intended that the invention be construed as including all such modifications and alterations insofar as they come within the scope of the appended claims or the equivalents thereof.

We claim:

1. A method of creating a conformal outline for layout of one or more devices on an integrated circuit, the method comprising the steps of:
   (a) defining a plurality of input rectangles in a Cartesian coordinate system having a first axis and a second axis, each input rectangle having two edges parallel to the first axis and two sides parallel to the second axis;
   (b) acquiring coordinates on the first axis where the sides of each input rectangle reside;
   (c) forming a sorted list of the acquired coordinates;
   (d) initializing a variable I=2;
   (e) identifying from the input rectangles first and second candidate rectangles having one of their respective sides positioned at the smallest and largest coordinates in the sorted list, respectively;
   (f) setting the other of the sides of the respective first and second candidate rectangles equal to the coordinate on the first axis stored in the $I^{th}$ position in the sorted list thereby forming a shared side;
   (g) for each candidate rectangle having coordinates on the first axis which overlap coordinates of one or more input rectangles on the first axis, modifying the lengths of the sides of the candidate rectangle as required so that they extend from the maximum to the minimum second axis coordinates of the one or more input rectangles; and
   (h) when the shared side with respect to one candidate rectangle does not coincide with or overlap the shared side with respect to the other candidate rectangle, modifying the length of the shared side with respect to the one candidate rectangle so that it coincides with or overlaps the shared side with respect to the other candidate rectangle.

2. The method as set forth in claim 1, further including, before step (f), the step of initializing a Best Solution variable that includes a cost.

3. The method as set forth in claim 2, further including the steps of:
   (i) determining a cost of the candidate rectangles;
   (j) when the cost determined in step (i) is more advantageous than the cost of the Best Solution, updating the Best Solution with the position of the candidate rectangles in the Cartesian coordinate system and the cost determined in step (i);
   (k) setting I=I+1; and
   (l) determining if I=(the number of coordinates in the sorted list) and, if not, repeating steps (f) through (k).

4. The method as set forth in claim 3, wherein step (i) includes the steps of:
   defining one or more penalty rectangles in the Cartesian coordinate system;
   determining an area of intersection between the candidate rectangles and the one or more penalty rectangles; and
   determining the cost of the candidate rectangles based on at least two of:
   the area of the candidate rectangles;

the area of intersection; and a penalty weight (PW) for the intersection.

5. The method as set forth in claim 3, wherein the cost in step (i) is determined utilizing the following equation:

$$\text{Cost} = (\text{Area of Candidate Rectangles}) + \sum_{k=0}^{k=A} PW_k * \sum_{i=0}^{i=B} \text{Area of Intersection} (\text{Penalty Rects}_k, \text{Candidate Rects}_i)$$

where A=(No. of Penalty Rects. −1) and

B=(No. of Candidate Rects. −1).

6. A method of creating a conformal outline for layout of one or more devices on an integrated circuit, the method comprising the steps of:

(a) defining a plurality of input rectangles in a Cartesian coordinate system having a first axis and a second axis, each input rectangle having two edges parallel to the first axis and two sides parallel to the second axis;

(b) acquiring coordinates on the first axis where each input rectangle's sides reside;

(c) forming a sorted list of the acquired coordinates;

(d) initializing a variable I=2;

(e) identifying from the input rectangles first and second candidate rectangles having one of their respective sides positioned at the smallest and largest coordinates in the sorted list, respectively, and a third candidate rectangle having its sides positioned between the smallest and largest coordinates in the sorted list;

(f) setting the side of the first candidate rectangle opposite the smallest coordinate in the sorted list and one side of the third candidate rectangle equal to the coordinate on the first axis stored in the $I^{th}$ position in the sorted list thereby forming a shared side;

(g) initializing a variable J=I+1;

(h) setting the side of the second candidate rectangle opposite the largest coordinate in the sorted list and the other side of the third candidate rectangle equal to the coordinate on the first axis stored in the $J^{th}$ position in the sorted list thereby forming another shared side;

(i) for each candidate rectangle having coordinates on the first axis which overlap coordinates of one or more input rectangles on the first axis, modifying the lengths of the sides of the candidate rectangle as required so that they extend from the maximum to the minimum second axis coordinates of the one or more input rectangles; and (j) when the shared side with respect to one candidate rectangle does not coincide with or overlap the same shared side with respect to the other candidate rectangle, modifying the length of the shared side with respect to the one candidate rectangle so that it coincides with or overlaps the same shared side with respect to the other candidate rectangle.

7. The method as set forth in claim 6, further including, before step (g), the step of initializing a Best Solution variable that comprises a cost.

8. The method as set forth in claim 7, further including the steps of:

(k) determining a cost of the candidate rectangles;

(l) when the cost determined in step (k) is more advantageous than the cost of the Best Solution, updating the Best Solution with the coordinates of the candidate rectangles in the Cartesian coordinate system and the cost determined in step (k);

(m) setting J=J+1; and (n) determining if J=(the number of coordinates in the sorted list) and, if not, repeating steps (h) through (m).

9. The method as set forth in claim 8, further including the steps of:

(o) setting I=I+1; and (p) determining if I=(the number of coordinates in the sorted list −1) and, if not, repeating steps (f) through (o).

10. The method as set forth in claim 8, wherein step (k) includes the steps of:

defining one or more penalty rectangles in the well area;

determining an area of intersection between the candidate rectangles and the one or more penalty rectangles; and determining the cost of the candidate rectangles based on at least two of:

the area of the candidate rectangles;

the area of intersection; and a penalty weight (PW) for the intersection.

11. The method as set forth in claim 8, wherein the cost in step (k) is determined utilizing the following equation:

$$\text{Cost} = (\text{Area of Candidate Rectangles}) + \sum_{k=0}^{k=A} PW_k * \sum_{i=0}^{i=B} \text{Area of Intersection} (\text{Penalty Rects}_k, \text{Candidate Rects}_i)$$

where A=(No. of Penalty Rects. −1) and

B=(No. of Candidate Rects. −1).

12. A method of creating a conformal outline for layout of one or more devices on an integrated circuit, the method comprising the steps of:

(a) defining a plurality of input geometries in a coordinate system having a first axis and a second axis, each input geometry having first and second edges parallel to the first axis and first and second sides parallel to the second axis;

(b) acquiring coordinates on the first axis where the sides of each input geometry reside;

(c) forming a sorted list of the acquired coordinates;

(d) identifying a first candidate geometry having its first side residing at the smallest coordinate in the sorted list;

(e) identifying a second candidate geometry having its second side residing at the largest coordinate in the sorted list;

(f) positioning the second side of the first candidate geometry and the first side of the second candidate geometry at a coordinate in the sorted list between the smallest and largest coordinates thereby forming a shared side;

(g) for each candidate geometry which has first axis coordinates which overlap first axis coordinates of one or more of the input geometries and which has at least one second axis coordinate extreme which does not coincide with a second axis coordinate extreme of the one or more input geometries, modifying the lengths of the sides of the candidate geometry so that opposite ends of each side terminate at the respective second axis coordinate extremes of the one or more input geometries; and (h) when the shared side with respect to one candidate geometry does not coincide with or completely overlap the shared side with respect to the other candidate geometry, modifying the length of the shared side with respect to the one candidate geometry so that it coincides with or completely overlaps the shared side with respect to the other candidate geometry.

13. The method as set forth in claim 12, further including the steps of:

(i) determining for the combination first and second candidate geometries a cost therefor;

(j) if the cost determined in step (i) is more advantageous than one of a previously determined cost and no cost, storing the cost determined in step (i), along with the positions of the first and second candidate geometries in the coordinate system; and (k) repeating steps (g) through (j) for each position of the shared side at coordinates in the sorted list between the smallest and largest coordinates.

14. The method as set forth in claim 13, wherein step (i) includes the steps of:

defining one or more penalty geometries in the well area;

determining an area of intersection between the candidate geometries and the one or more penalty geometries; and determining the cost of the candidate geometries based on at least two of:
the area of the candidate geometries;
the area of intersection; and
a penalty weight (PW) for the intersection.

15. A method of creating a conformal outline for layout of one or more devices on an integrated circuit, the method comprising the steps of:

(a) defining a plurality of input geometries in a coordinate system having a first axis and a second axis, each input geometry having first and second edges parallel to the first axis and first and second sides parallel to the second axis;

(b) acquiring coordinates on the first axis where the sides of each input geometry reside;

(c) forming a sorted list of the acquired coordinates;

(d) identifying a first candidate geometry having its first side residing at the smallest coordinate in the sorted list;

(e) identifying a second candidate geometry having its second side residing at the largest coordinate in the sorted list;

(f) identifying a third candidate geometry having its first and second sides residing between the smallest and largest coordinates in the sorted list;

(g) positioning the second side of the first candidate geometry and the first side of the third candidate geometry at one coordinate in the sorted list between the smallest and largest coordinates in the sorted list thereby forming a first shared side;

(h) positioning the second side of the third candidate geometry and the first side of the second candidate geometry at another coordinate in the sorted list between the one coordinate and the largest coordinate in the sorted list thereby forming a second shared side;

(i) for each candidate geometry which has first axis coordinates which overlap first axis coordinates of one or more of the input geometries and which has at least one second axis coordinate extreme which does not coincide with a second axis coordinate extreme of the one or more input geometries, modifying the lengths of the sides of the candidate geometry so that opposite ends of each side terminate at the respective second axis coordinate extremes of the one or more input geometries; and (j) when the shared side with respect to one candidate geometry does not coincide with or completely overlap the shared side with respect to an adjacent candidate geometry, modifying the length of the shared side with respect to the one candidate geometry so that it coincides with or completely overlaps the shared side with respect to the adjacent candidate geometry.

16. The method as set forth in claim 15, further including the steps of:

(k) determining for the combination of the first, second and third candidate geometries a cost therefor;

(l) if the cost determined in step (k) is more advantageous than one of a previously determined cost and no cost, storing the cost determined in step (k), along with the positions of the first, second and third candidate geometries in the coordinate system;

(m) repeating steps (i) through (l) for each position of the second shared side at coordinates in the sorted list between the coordinate in the sorted list where the first shared side resides and the largest coordinate in the sorted list.

17. The method as set forth in claim 16, further including the step of:

(n) repeating steps (i) through (m) for each position of the first shared side at coordinates in the sorted list between the one coordinate and the second from the largest coordinate.

18. The method as set forth in claim 16, wherein step (k) includes the steps of:

defining one or more penalty geometries in the well area;

determining an area of intersection between the candidate geometries and the one or more penalty geometries; and determining the cost of the candidate geometries based on at least two of:
the area of the candidate geometries;
the area of intersection; and
a penalty weight (PW) for the intersection.

19. A method of creating a conformal outline for the layout of one or more devices on an integrated circuit, the method comprising:

defining a plurality of adjoining candidate rectangles which encompass a plurality of input rectangles, wherein the outline of the adjoining candidate rectangles defines the conformal outline, each input rectangle has left and right sides, and top and bottom edges, each candidate rectangle has left and right sides, and top and bottom edges, and each pair of adjacent candidate rectangles define a shared side or edge that is coincident with a respective side or edge of at least one input rectangle;

stepping each shared side or edge to at least one other side or edge, respectively, of one of the input rectangles;

determining, for each step of each shared side or edge a cost for the candidate rectangles;

selecting as the conformal outline the outline of the candidate rectangles having the most advantageous cost; and at least one of:
(i) for each step of each shared side, adjusting the lengths of the respective sides of at least the pair of candidate rectangles defining the shared side whereupon the top and bottom edges of each of the pair of candidate rectangles are coincident with the topmost and bottommost edges of any input rectangles which overlap the candidate rectangle; and (ii) for each step of each shared edge, adjusting the lengths of the respective edges of at least the pair of candidate rectangles defining the shared edge whereupon the left and right sides of each of the pair of candidate rectangles are coincident with the leftmost and rightmost sides of any input rectangles which overlap the candidate rectangle.

* * * * *

UNITED STATES PATENT AND TRADEMARK OFFICE
CERTIFICATE OF CORRECTION

PATENT NO. : 6,711,725 B1
DATED : March 23, 2004
INVENTOR(S) : Rutenbar et al.

It is certified that error appears in the above-identified patent and that said Letters Patent is hereby corrected as shown below:

Column 13,
Line 51, "Program flow then" should read -- Program flow then advances to step 251. --
Line 52, "step 251," should read -- In step 251, --

Signed and Sealed this

Tenth Day of August, 2004

JON W. DUDAS
*Acting Director of the United States Patent and Trademark Office*